(12) United States Patent
Kuo et al.

(10) Patent No.: US 12,543,569 B2
(45) Date of Patent: Feb. 3, 2026

(54) PACKAGE WITH IMPROVED HEAT DISSIPATION EFFICIENCY AND METHOD FOR FORMING THE SAME

(71) Applicant: Taiwan Semiconductor Manufacturing Co., Ltd., Hsinchu (TW)

(72) Inventors: Hung-Yi Kuo, Taipei (TW); Chen-Hua Yu, Hsinchu (TW); Kuo-Chung Yee, Taoyuan (TW); Cheng-Chieh Hsieh, Tainan (TW); Chung-Ju Lee, Hsinchu (TW); Szu-Wei Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 763 days.

(21) Appl. No.: 17/856,689

(22) Filed: Jul. 1, 2022

(65) Prior Publication Data

US 2024/0006270 A1  Jan. 4, 2024

(51) Int. Cl.
| | |
|---|---|
| *H01L 23/473* | (2006.01) |
| *H01L 21/56* | (2006.01) |
| *H01L 23/00* | (2006.01) |
| *H01L 23/31* | (2006.01) |
| *H01L 25/00* | (2006.01) |

(Continued)

(52) U.S. Cl.
CPC ......... *H01L 23/473* (2013.01); *H01L 21/563* (2013.01); *H01L 23/3135* (2013.01); *H01L 25/0655* (2013.01); *H01L 25/18* (2013.01); *H01L 25/50* (2013.01); *H01L 24/16* (2013.01); *H01L 24/29* (2013.01); *H01L 24/32* (2013.01); *H01L 24/33* (2013.01); *H01L 24/73* (2013.01); *H01L 24/94* (2013.01); *H01L 2224/16225* (2013.01); *H01L 2224/29186* (2013.01); *H01L 2224/32221* (2013.01); *H01L 2224/32225* (2013.01); *H01L 2224/33181* (2013.01); *H01L 2224/73204* (2013.01); *H01L 2224/94* (2013.01)

(58) Field of Classification Search
None
See application file for complete search history.

(56) References Cited

U.S. PATENT DOCUMENTS

| | | | |
|---|---|---|---|
| 9,613,931 B2 * | 4/2017 | Lin | ..... H01L 25/0652 |
| 10,910,321 B2 * | 2/2021 | Hsieh | ..... H01L 21/4853 |

(Continued)

FOREIGN PATENT DOCUMENTS

TW    I727227 B    5/2021

*Primary Examiner* — Dale E Page
*Assistant Examiner* — Rohit Parthasarathy
(74) *Attorney, Agent, or Firm* — Slater Matsil, LLP

(57) ABSTRACT

In an embodiment, a package includes an interposer; a first integrated circuit device attached to the interposer, wherein the first integrated circuit device includes a die and a heat dissipation structure, the die having an active surface facing the interposer and an inactive surface opposite to the active surface, the heat dissipation structure attached to the inactive surface of the die and including a plurality of channels recessed from a first surface of the heat dissipation structure, the first surface of the heat dissipation structure facing away from the die; and an encapsulant disposed on the interposer and laterally around the die and the heat dissipation structure, wherein a top surface of the encapsulant is coplanar with the top surface of the heat dissipation structure.

20 Claims, 23 Drawing Sheets

(51) Int. Cl.
*H01L 25/065* (2023.01)
*H01L 25/18* (2023.01)

(56) References Cited

U.S. PATENT DOCUMENTS

| | | | | |
|---|---|---|---|---|
| 11,164,855 | B2* | 11/2021 | Chen | H01L 24/32 |
| 11,410,910 | B2* | 8/2022 | Hsiao | H01L 21/486 |
| 11,728,238 | B2* | 8/2023 | Yeh | H01L 23/053 |
| | | | | 257/712 |
| 11,848,246 | B2* | 12/2023 | Chen | H01L 21/563 |
| 11,876,035 | B2* | 1/2024 | Simon | H01L 23/473 |
| 2004/0145047 | A1* | 7/2004 | Kim | H01L 23/473 |
| | | | | 257/E23.098 |
| 2008/0308258 | A1* | 12/2008 | Pan | H01L 23/473 |
| | | | | 165/104.19 |
| 2008/0308926 | A1* | 12/2008 | Hung | H01L 23/3128 |
| | | | | 257/E23.116 |
| 2013/0270690 | A1* | 10/2013 | Hsieh | H01L 23/473 |
| | | | | 257/713 |
| 2016/0035704 | A1* | 2/2016 | Luo | H01L 21/3065 |
| | | | | 438/109 |
| 2016/0322330 | A1* | 11/2016 | Lin | H01L 25/0652 |
| 2019/0067155 | A1* | 2/2019 | Zhou | H10D 30/024 |
| 2019/0067207 | A1* | 2/2019 | Hu | H01L 21/4871 |
| 2019/0164871 | A1* | 5/2019 | Lee | H01L 23/42 |
| 2019/0355637 | A1* | 11/2019 | Chen | H01L 21/56 |
| 2020/0006176 | A1* | 1/2020 | Tsai | H01L 23/562 |
| 2020/0105644 | A1* | 4/2020 | Teng | H01L 23/473 |
| 2020/0176352 | A1* | 6/2020 | Chang | H01L 23/4334 |
| 2020/0235023 | A1* | 7/2020 | Chen | B22F 1/10 |
| 2020/0273777 | A1* | 8/2020 | Jain | H01L 21/565 |
| 2020/0373235 | A1* | 11/2020 | Collins | H01L 23/481 |
| 2021/0035881 | A1* | 2/2021 | Mallik | H01L 23/42 |
| 2021/0057380 | A1* | 2/2021 | Kim | H01L 25/50 |
| 2021/0082894 | A1* | 3/2021 | Chen | H01L 24/73 |
| 2021/0202390 | A1* | 7/2021 | Hsu | H01L 23/49833 |
| 2022/0037231 | A1* | 2/2022 | Hsiao | H01L 21/563 |
| 2022/0310470 | A1* | 9/2022 | Chen | H01L 25/0652 |
| 2023/0387039 | A1* | 11/2023 | Wu | H01L 23/552 |
| 2024/0006270 | A1* | 1/2024 | Kuo | H01L 24/13 |
| 2024/0145342 | A1* | 5/2024 | Shao | H01L 24/29 |
| 2024/0222143 | A1* | 7/2024 | Chen | H01L 23/36 |
| 2024/0249999 | A1* | 7/2024 | Hsiao | H01L 21/563 |

* cited by examiner

PACKAGE WITH IMPROVED HEAT DISSIPATION EFFICIENCY AND METHOD FOR FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6-18A, 19, 20A are cross-sectional views of intermediate stages in the manufacturing of an integrated circuit package, in accordance with some embodiments.

DETAILED DESCRIPTION

Figure 1:
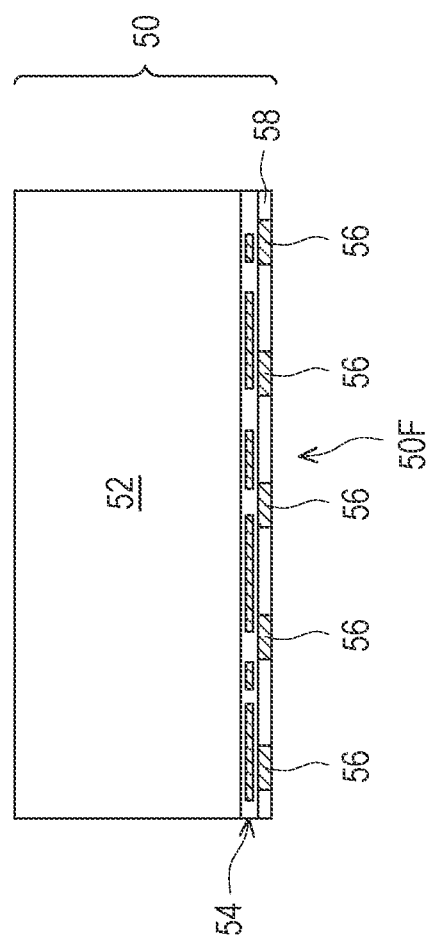
FIG. 1 is a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a package is formed that includes an integrated circuit device attached to an interposer. The integrated circuit device may include a heat dissipation structure over an integrated circuit die. The heat dissipation structure may include a plurality of micro-channels recessed from its top surface, which may allow a cooling fluid to flow through and therefore can effectively dissipate heat generated by the integrated circuit die and/or other integrated circuit devices in the package. The heat dissipation efficiency of the package may be improved.

FIG. 1 is a cross-sectional view of an integrated circuit die 50. One or more integrated circuit dies 50 will be packaged in subsequent processing to form integrated circuit packages. Each integrated circuit die 50 may be a logic die (e.g., central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), an application-specific integrated circuit (ASIC) die, the like, or combinations thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58 (if present).

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing downward in FIG. 1) and an inactive surface (e.g., the surface facing upward in FIG. 1). Devices are at the active surface of the semiconductor substrate 52. The devices may be active devices (e.g., transistors, diodes, etc.) and/or passive devices (e.g., capacitors, resistors, etc.). The inactive surface may be free from devices.

The interconnect structure 54 is on the active surface of the semiconductor substrate 52, and is used to electrically connect the devices of the semiconductor substrate 52 to form an integrated circuit. The interconnect structure 54 may include one or more dielectric layer(s) and respective one or more metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

A dielectric layer 58 is optionally disposed at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during the formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are coplanar (within process variations) and are exposed at the front side 50F of the integrated circuit die 50.

Figure 2A:
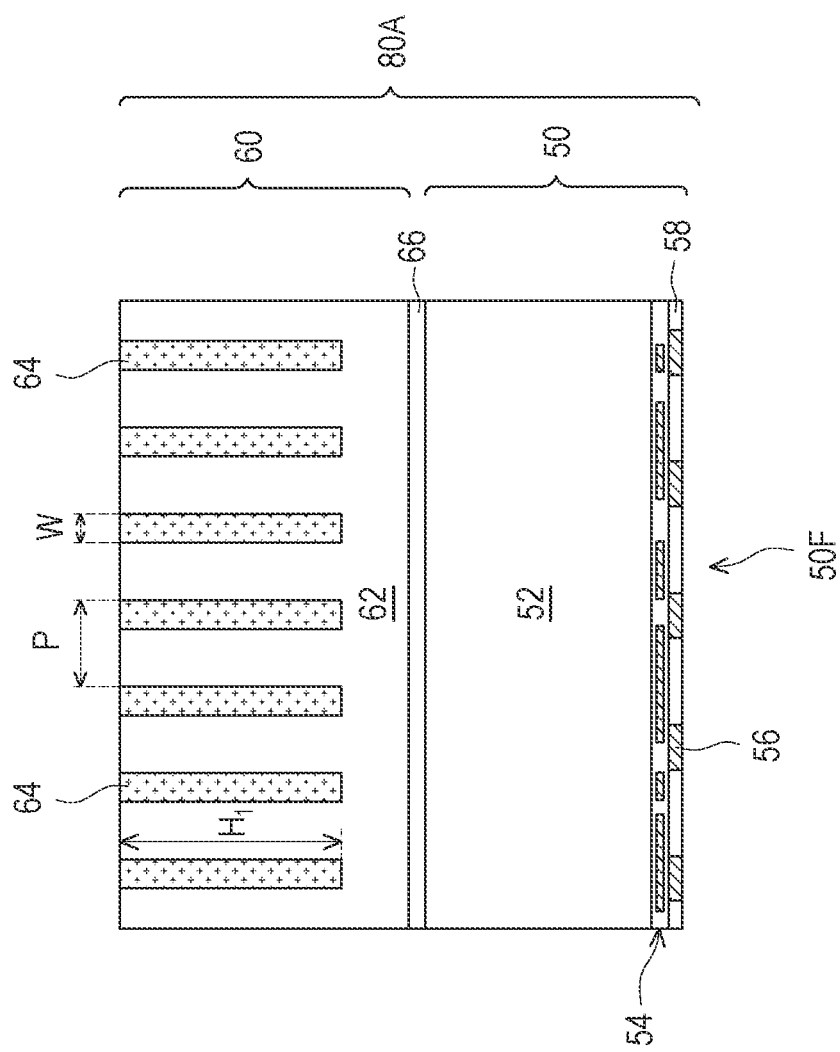
FIGS. 2A and 2B illustrate a cross-sectional view and a plan view, respectively, of an integrated circuit device, in accordance with some embodiments.
Figure 2B:
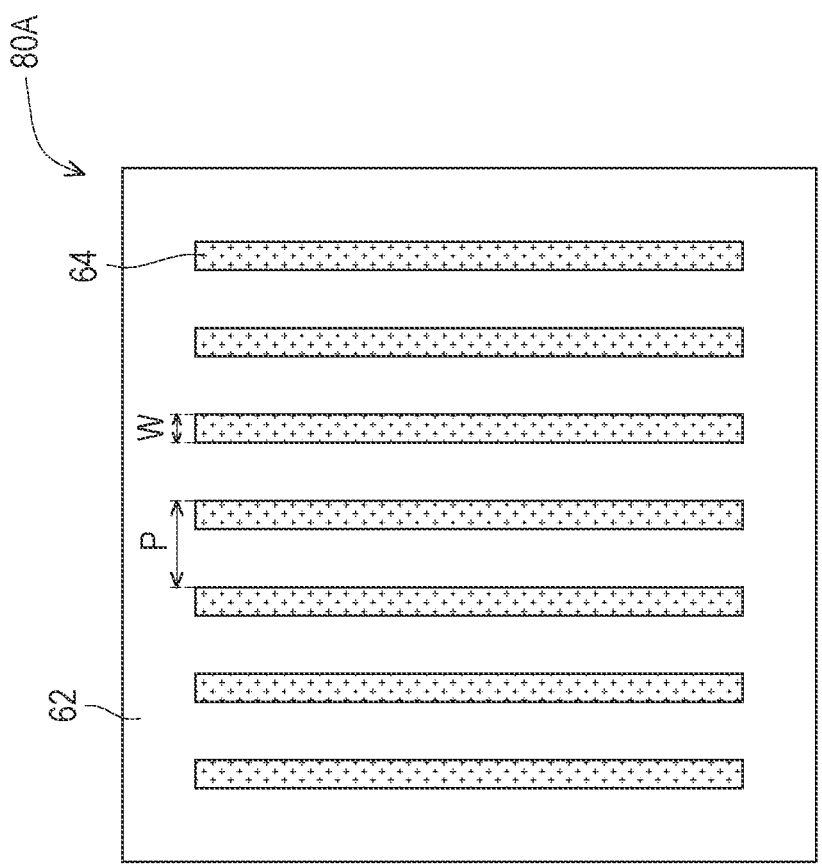

FIGS. 2A and 2B are a cross-sectional view and a plan view of a first integrated circuit device 80A, respectively, in accordance with some embodiments. The first integrated circuit device 80A may include a heat dissipation structure 60 attached to the integrated circuit die 50 (see, e.g., FIG. 1). In some embodiments, the heat dissipation structure 60 includes a bulk substrate 62 and may not include metallization layer(s), active or inactive devices, or the like. The bulk substrate 62 may be formed of a material with high thermal conductivity, such as silicon, a semiconductor material similar to the semiconductor substrate 52, or the like. The heat dissipation structure 60 may also be referred to as a dummy die or as a thermal enhancement die.

In some embodiments, the heat dissipation structure 60 also includes a plurality of strips 64 embedded in the bulk substrate 62. The plurality of strips 64 may extend along a longitude direction (e.g., into and out the plane of the cross-sectional view shown in FIG. 2A) and be exposed from a top surface of the bulk substrate 62. The strips 64 may have a top surface coplanar with the top surface of the bulk substrate 62. The strips 64 may be formed in a regular pattern, such as a repeat pattern of rectangular strips in a plan view. For example, the adjacent strips 64 may have a pitch P in a range from 20 um to 700 um. In some embodiments, each of the strips 64 has a width W in a range from 30 um to 100 um and a height $H_1$ in a range from 50 um to 600 um. A ratio of the height $H_1$ to the width W may be in a range from 1 to 15. In some embodiments, the strips 64 have straight sidewalls which are substantially perpendicular or inclined in respect to the top surface of the bulk substrate 62. In some embodiments, the strips 64 include a polymer material such as epoxy, polyacrlates, polyimide, or a combination thereof, or any material that can be suitably removed by an etching process from the bulk substrate 62. As will be discussed in greater detail below, the material of the strips 64 will be removed to form channels for allowing cooling fluid to flow through for dissipating heat. The regular pattern of strips is shown for illustrative purposes, and other patterns, regular or irregular, may be used.

The heat dissipation structure 60 may be attached to the integrated circuit die 50 through direct bonding or an adhesive layer. For example, in some embodiments in which the heat dissipation structure 60 is attached to the integrated circuit die 50 through direct bonding, a bottom surface of the heat dissipation structure 60 is directly bonded to the inactive surface of the integrated circuit die 50. In such embodiments, a bonding film 66 such as a silicon oxide layer may be formed on one or both the bulk substrate 62 of the heat dissipation structure 60 and the semiconductor substrate 52 of the integrated circuit die 50 to aid in the bonding process. In embodiments in which the heat dissipation structure 60 is attached to the integrated circuit die 50 through an adhesive layer, the bonding film 66 may be a thermal interfacial material. The thermal interfacial material may be a polymeric material, solder paste, indium solder paste, or the like.

Figure 3:
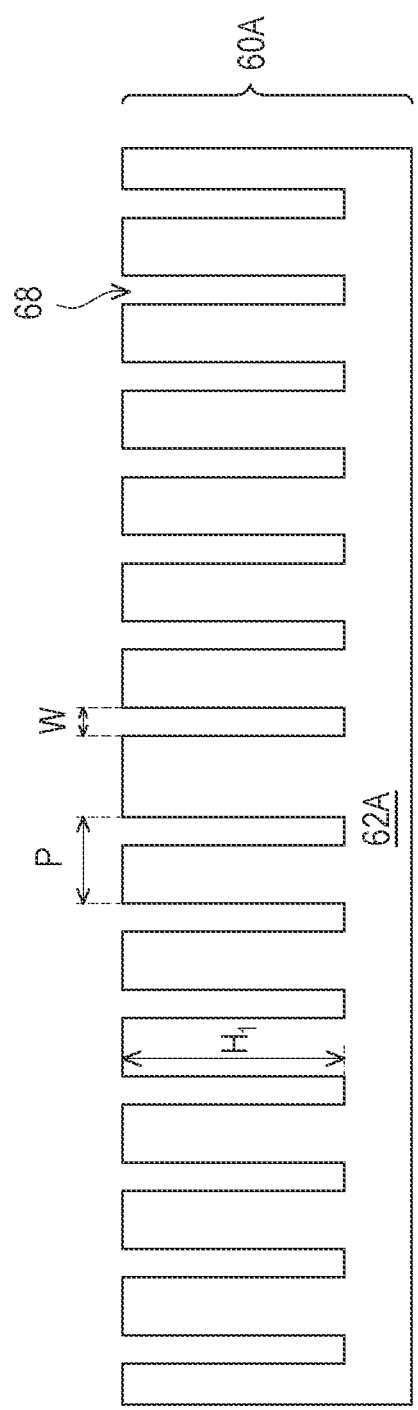
FIGS. 3-5 are cross-sectional views of intermediate stages in the manufacturing of an integrated circuit device, in accordance with some embodiments.
Figure 4:
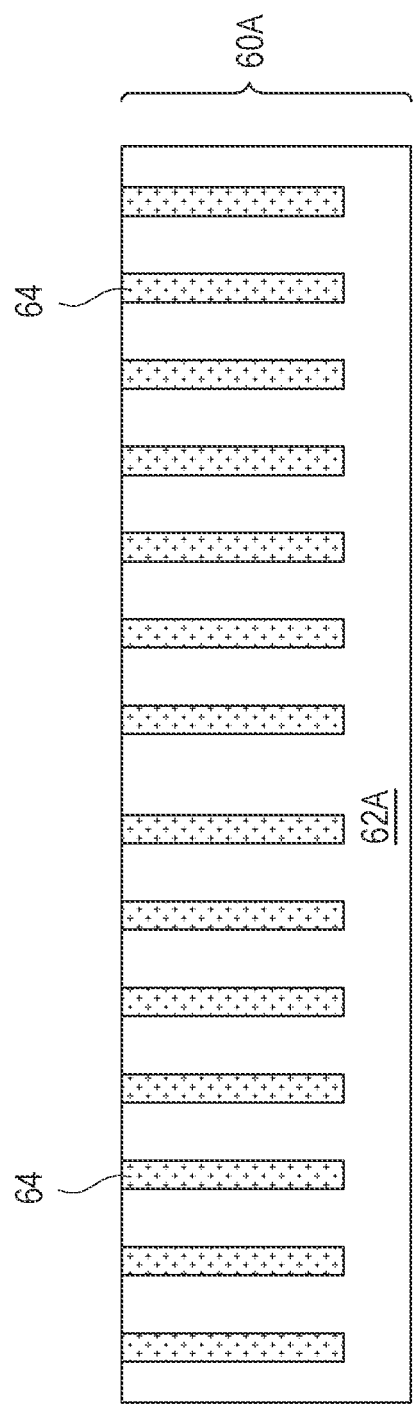
Figure 5:
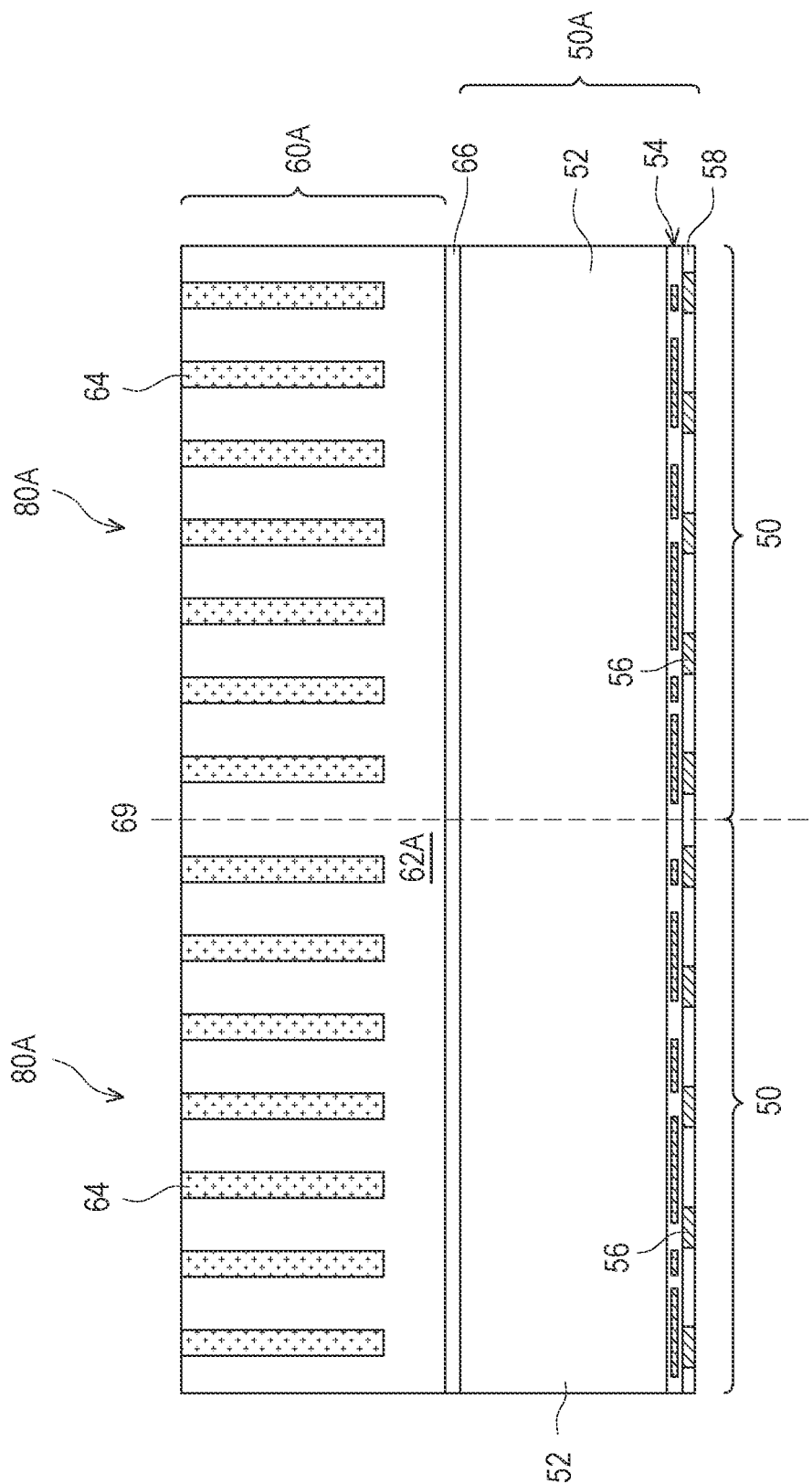

FIGS. 3-5 illustrate an exemplary flow of forming the structure described for FIG. 2A in accordance with some embodiments. In FIG. 3, a blank wafer 60A having a plurality of trenches 68 is shown. The blank wafer 60A may include a bulk substrate 62A, which is a wafer form of the semiconductor substrate 52 as described for FIG. 1 and will be singulated to become a plurality of the bulk substrates 62 as illustrated in FIG. 2A in subsequent processing. The plurality of trenches 68 may be formed in the bulk substrate 62A. In some embodiments, the trenches 68 may have the same pattern as the strips 64, such as having the width W and the pitch P, and may have a depth same as the height $H_1$ of the strips 64. The formation of the trenches 68 may include forming a patterned mask (not shown), such as a hard mask that includes patterns of the trenches 68, on the top surface of the bulk substrate 62A, and etching the bulk substrate 62A according to the patterns of the patterned mask. The etching process may include a dry etching such as reactive ion etching (RIE) or the like. After the trenches 68 are formed, the patterned mask may be removed by any acceptable removable process, such as a wet etching or a dry etching.

In FIG. 4, the trenches 68 are filled to form a plurality of the strips 64 in the bulk substrate 62A in accordance with some embodiments. In some embodiments, the strips 64 are formed by chemical vapor deposition (CVD), spin coating, lamination, or the like. An as-formed material of the strips 64 may fill the trenches 68 and have an excess portion (not shown) over a top surface of the bulk substrate 62A. A planarization process, such as chemical mechanical polishing (CMP) or mechanical grinding, may be performed to remove the excess portion of the material of the strips 64 over the top surface of the bulk substrate 62A, leaving the strips 64 embedded in the bulk substrate 62A and exposed from a top surface of the bulk substrate 62A. In some embodiments, the thickness of the blank wafer 60A may be adjusted by grinding the blank wafer 60A from its bottom surface.

In FIG. 5, a wafer 50A comprising a plurality of the integrated circuit dies 50 is formed or provided, and the blank wafer 60A including the strips 64 is attached to the wafer 50A. In some embodiments, the bulk substrate 62A of the blank wafer 60A is bonded to the wafer 50A by wafer-to-wafer bonding. For example, a bottom surface of the bulk substrate 62A may be attached to the inactive surface of the wafer 50A (e.g., inactive surface of the semiconductor substrate 52). The wafer-to-wafer bonding may be performed using direct bonding or adhesion using, e.g., the bonding film 66 as discussed above. Although not illustrated in detail here, it is appreciated that the wafer-to-wafer bonding may be implemented by other suitable techniques.

FIG. 5 further illustrates singulation of the blank wafer 60A, the bonding film 66, and the wafer 50A along the scribe lines 69 to form individual bonded die structures, such as the first integrated circuit device 80A illustrated in FIG. 2A. FIG. 5 illustrates a single scribe line 69 to form two first integrated circuit device 80A for illustrative purposes, and embodiments may include any number of scribe lines to form more individual structures such as those illustrated in FIG. 2A.

Figure 6:
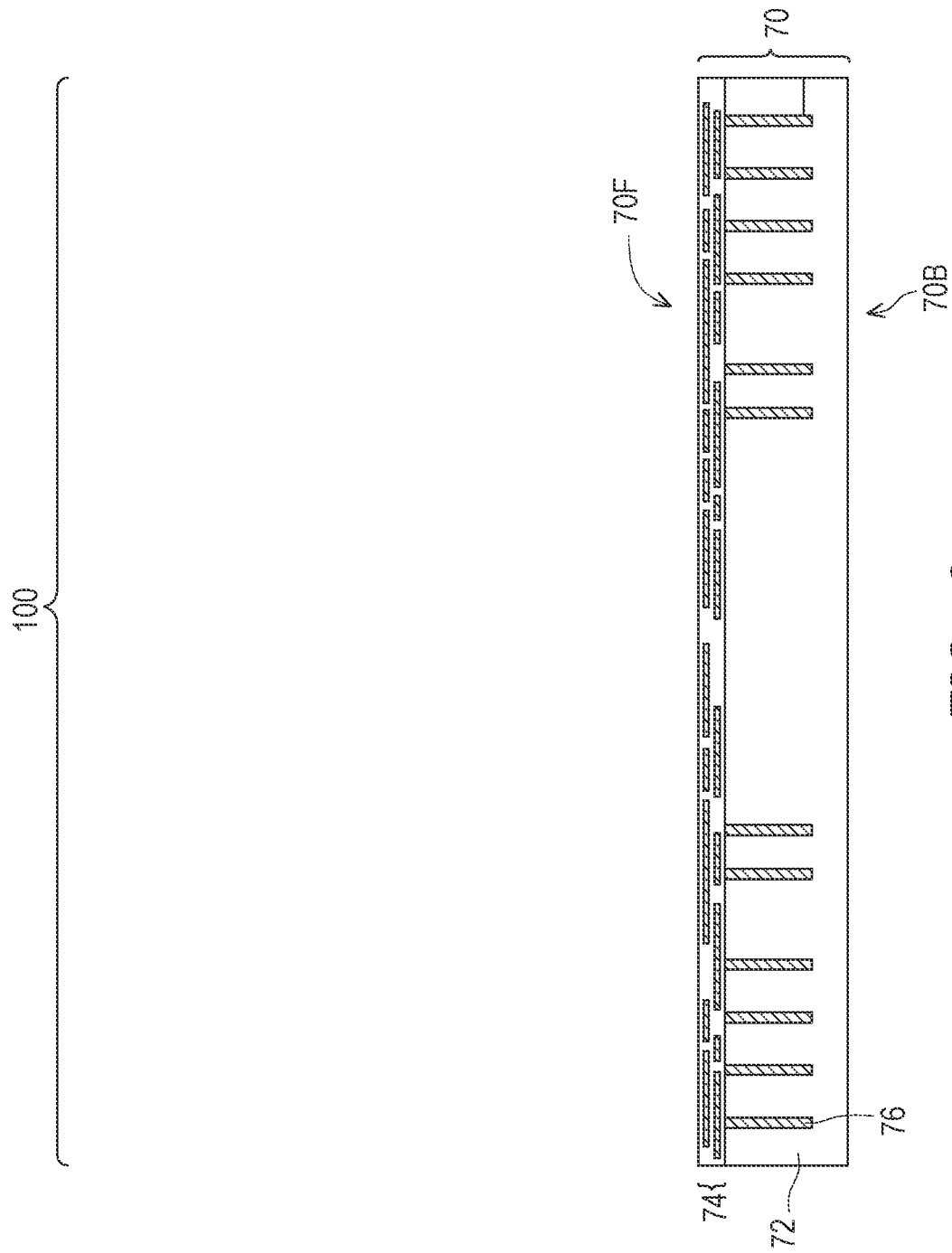

FIGS. 6-17A are cross-sectional views of intermediate stages in the manufacturing of an integrated circuit package 100 comprising the first integrated circuit device 80A (see FIG. 2A), in accordance with some embodiments. Referring first to FIG. 6, an interposer 70 is shown. The interposer 70 may be a wafer, and a plurality of the first integrated circuit devices 80A may be attached to the interposer 70 using chip-on-wafer (CoW) techniques and later singulated to form individual packages. It is also appreciated that the embodiments illustrated in this disclosure may also be applied to 3DIC packages.

In FIG. 6, the interposer 70 is obtained or formed. In some embodiments, the interposer 70 includes a substrate 72, an interconnect structure 74, and through vias 76. The substrate 72 may be a bulk semiconductor substrate, a semiconductor-on-insulator (SOI) substrate, a multi-layered semiconductor substrate, or the like. The substrate 72 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 72 may be doped or undoped. In some embodiments, the substrate 72 does not include active devices therein, although the interposers may include passive devices formed in and/or on a front surface (e.g., the surface facing upward in FIG. 3) of the substrate 72.

The interconnect structure 74 is over the front surface of the substrate 72, and is used to electrically connect the devices (if any) of the substrate 72 and/or the devices attached to the interposer 70. The interconnect structure 74 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobutene (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The interconnect structure 74 may be formed by a damascene process, such as a single damascene process, a dual damascene process, or the like.

In some embodiments, die connectors and a dielectric layer (not separately illustrated) are at the front side 70F of the interposer 70. Specifically, the interposer 70 may include die connectors and a dielectric layer that are similar to those of the integrated circuit die 50 described for FIG. 1. For example, the die connectors and the dielectric layer may be part of an upper metallization layer of the interconnect structure 74.

The through vias 76 extend into the interconnect structure 74 and/or the substrate 72. The through vias 76 are electrically connected to metallization layer(s) of the interconnect structure 74. As an example to form the through vias 76, recesses can be formed in the interconnect structure 74 and/or the substrate 72 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 74 or the substrate 72 by, for example, a CMP. Remaining portions of the barrier layer and conductive material form the through vias 76.

Figure 7:
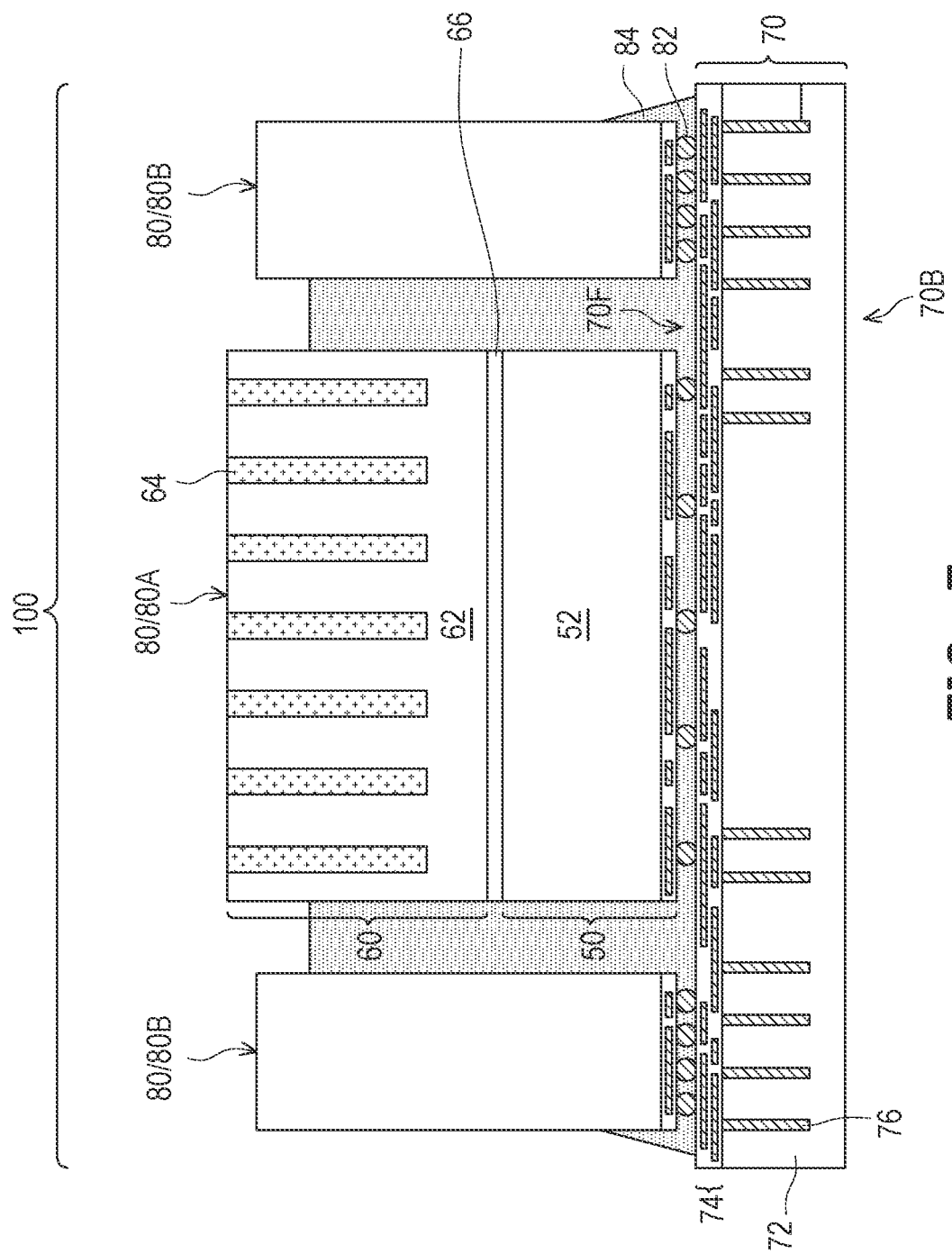

FIG. 7 illustrates the first integrated circuit device 80A and the second integrated circuit devices 80B attached to the interposer 70, wherein the second integrated circuit devices 80B and the first integrated circuit device 80A are collectively referred to as integrated circuit devices 80. The second integrated circuit devices 80B may be a memory die, a stack of memory dies, an integrated circuit die (similar to the integrated circuit die 50 described for FIG. 1), or a stack of the integrated circuit dies, or the like. The first integrated circuit device 80A may have a different function from the second integrated circuit devices 80B. For example, the first integrated circuit device 80A may be a logic device, such as a central processing unit (CPU), graphics processing unit (GPU), system-on-a-chip (SoC), microcontroller, application-specific integrated circuit (ASIC), or the like. The second integrated circuit device 80B may be a memory device, such as a dynamic random access memory (DRAM) device, static random access memory (SRAM) device, hybrid memory cube (HMC) module, a high bandwidth memory (HBM) module, or the like. The first integrated circuit device 80A and the second integrated circuit devices 80B may be formed in processes of a same technology node, or may be formed in processes of different technology nodes. For example, the first integrated circuit device 80A may be of a more advanced process node than the second integrated circuit device 80B.

In FIG. 7, the integrated circuit devices 80 are attached to the interposer 70 with solder bonds, such as with conductive connectors 82. The integrated circuit devices 80 may be placed on the interconnect structure 74 using, e.g., a pick-and-place tool. The conductive connectors 82 may be formed of a reflowable conductive material, such as solder, and may further include other conductive materials such as copper, aluminum, gold, nickel, silver, palladium, tin, lead, the like, or a combination thereof. In some embodiments, the conductive connectors 82 are formed by initially forming a layer of solder through methods such as evaporation, electroplating, printing, solder transfer, ball placement, or the like. Once a layer of solder has been formed on the interposer 70, a reflow may be performed in order to shape the conductive connectors 82 into desired bump shapes. Attaching the integrated circuit devices 80 to the interposer 70 may include placing the integrated circuit devices 80 on the interposer 70 and reflowing the conductive connectors 82. The conductive connectors 82 form joints between corresponding die connectors of the interposer 70 and the integrated circuit devices 80, electrically connecting the interposer 70 to the integrated circuit devices 80.

An underfill 84 may be formed around the conductive connectors 82, and between the interposer 70 and the integrated circuit devices 80. The underfill 84 may reduce stress and protect the joints resulting from the reflowing of the conductive connectors 82. The underfill 84 may be formed of an underfill material such as an epoxy, or the like. The underfill 84 may be formed by a capillary flow process after the integrated circuit devices 80 are attached to the interposer 70, or may be formed by a suitable deposition method before the integrated circuit devices 80 are attached to the interposer 70. The underfill 84 may be applied in liquid or semi-liquid form and then subsequently cured. The underfill 84 may have various heights, depending on the distances between the first integrated circuit device 80A and the second integrated circuit devices 80B. In the embodiment shown, the underfill 84 may have a height greater than integrated circuit die 50 and in contact with sidewalls of the heat dissipation structure 60 of the first integrated circuit device 80A. In some embodiments, the underfill 84 has a top surface higher than a bottom surface of the strips 64. In some embodiments not shown in Figures, the underfill 84 has a top surface level with the top surface of the heat dissipation structure 60.

Figure 8:
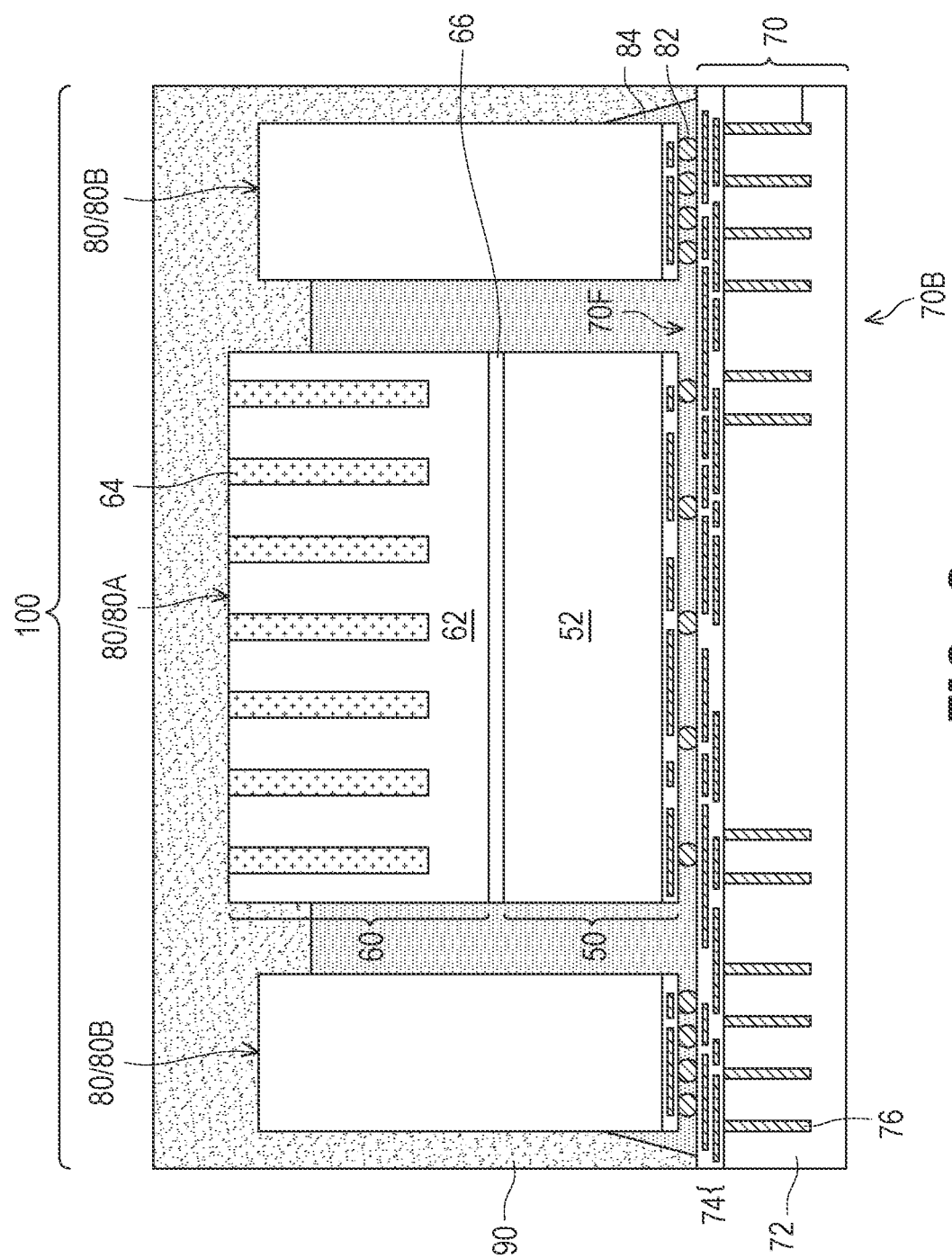

In FIG. 8, an encapsulant 90 is formed over the interposer 70 and the various components on the interposer 70. After formation, the encapsulant 90 encapsulates the integrated circuit devices 80 and the underfill 84. The encapsulant 90 may be a molding compound, which may be a polymer, a resin, an epoxy, or the like, and filler particles in the base material. The filler particles may be dielectric particles of $SiO_2$, $Al_2O_3$, or the like, and may have spherical shapes. Also, the spherical filler particles may have a plurality of different diameters. The encapsulant 90 may be applied by compression molding, transfer molding, or the like, and is formed over the interposer 70 such that the heat dissipation structure 60 and the integrated circuit devices 80 are buried or covered. The encapsulant 90 may be applied in liquid or semi-liquid form and then subsequently cured.

Figure 9:
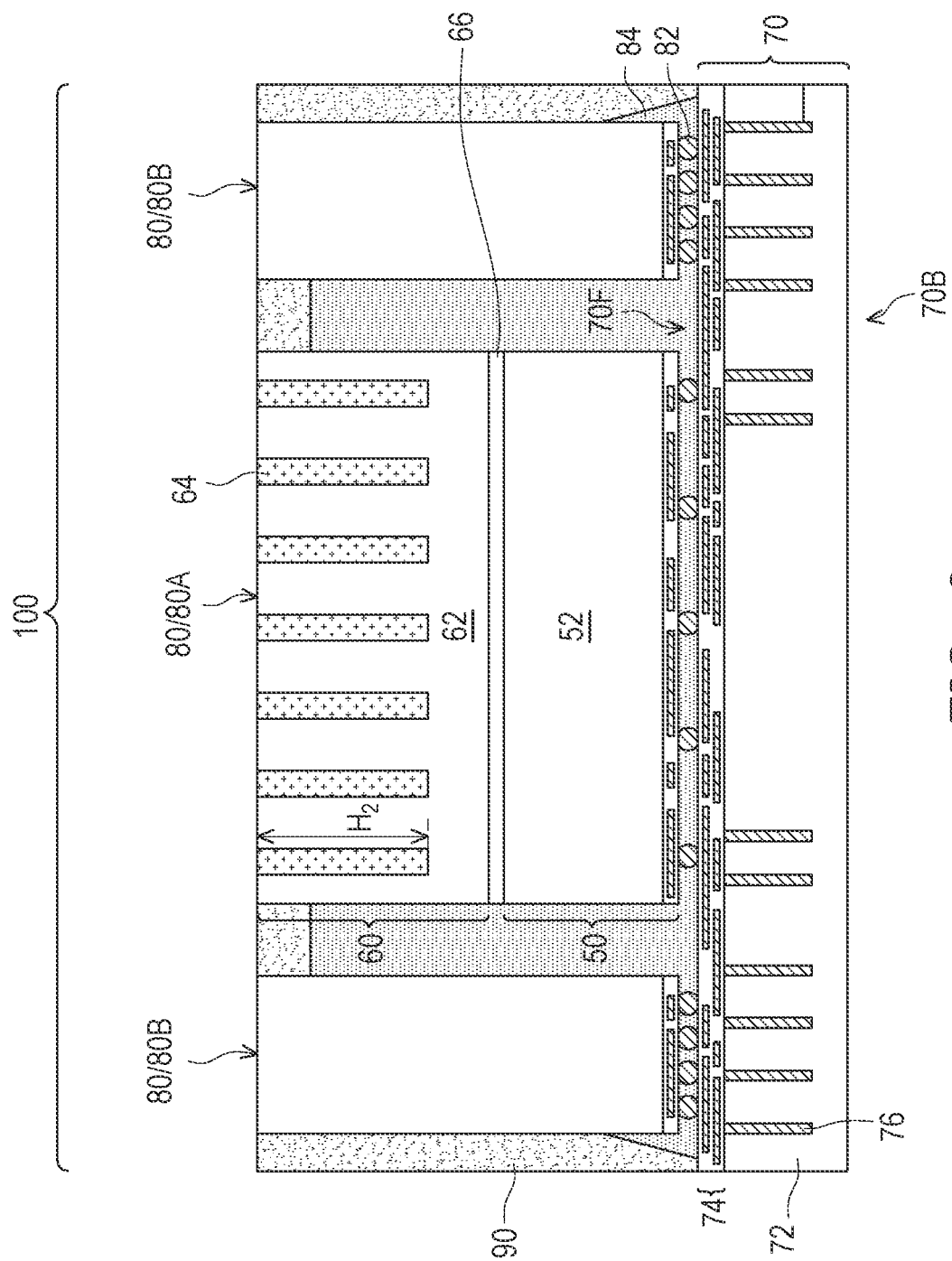

In FIG. 9, the encapsulant 90 is thinned to expose the first integrated circuit device 80A. In some embodiments, the second integrated circuit devices 80B may also be exposed as illustrated in FIG. 9. Specifically, the thinning removes the portions of the encapsulant 90 covering the top surface of the heat dissipation structure 60 of the first integrated circuit device 80A, thereby exposing the heat dissipation structure 60. In some embodiments, the thinning also includes removing a portion of the second integrated circuit devices 80B and/or a portion of the heat dissipation structure 60 (including the strips 64) of the first integrated circuit device 80A. After the thinning process, the top surfaces of the heat dissipation structure 60 of the first integrated circuit device 80A and the encapsulant 90 are coplanar (within process variations). Additionally, top surface of one or more of the second integrated circuit devices 80B may also be coplanar (within process variations) with top surfaces of the heat dissipation structure 60 of the first integrated circuit device 80A and the encapsulant 90. In some embodiments, the strips 64 have a height $H_2$ ranging from 40 um to 590 um. After thinning, a ratio of the height $H_2$ to the width W may be from 1 to 15. In some embodiments, a ratio of the height $H_2$ to the overall thickness $H_3$ of the heat dissipation structure 60 (after the thinning process) is in a range from 0.1 to 0.77. The thickness $H_3$ may be in a range from 400 um to 775 um. The thinning process may be a grinding process, a chemical-mechanical polish (CMP), an etch-back, combinations thereof, or the like.

Figure 10:
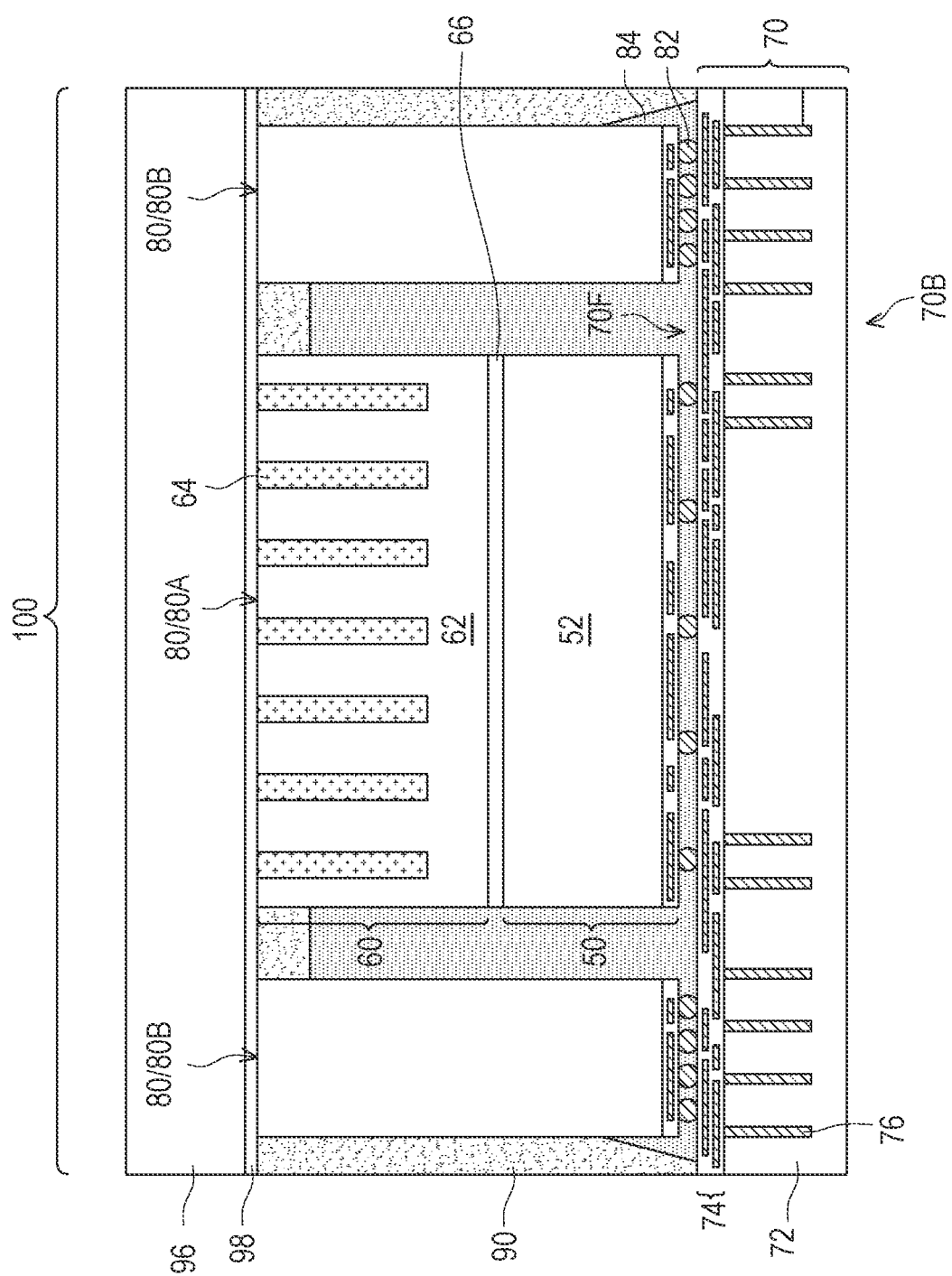

In FIG. 10, the intermediate structure may be placed on a carrier substrate 96 or other suitable support structure for subsequent processing. For example, the carrier substrate 96 may be attached to the first integrated circuit device 80A, the second integrated circuit devices 80B, and the encapsulant 90 by a release layer 98. In some embodiments, the carrier substrate 96 is a substrate such as a bulk semiconductor or a glass substrate having a wafer or panel shape or the like. The release layer 98 may be formed of a polymer-based material, which may be removed along with the carrier substrate 96 from the structure after processing. In some embodiments, the release layer 98 is an epoxy-based thermal-release material, which loses its adhesive property when heated, such as a light-to-heat-conversion (LTHC) release coating.

Figure 11:
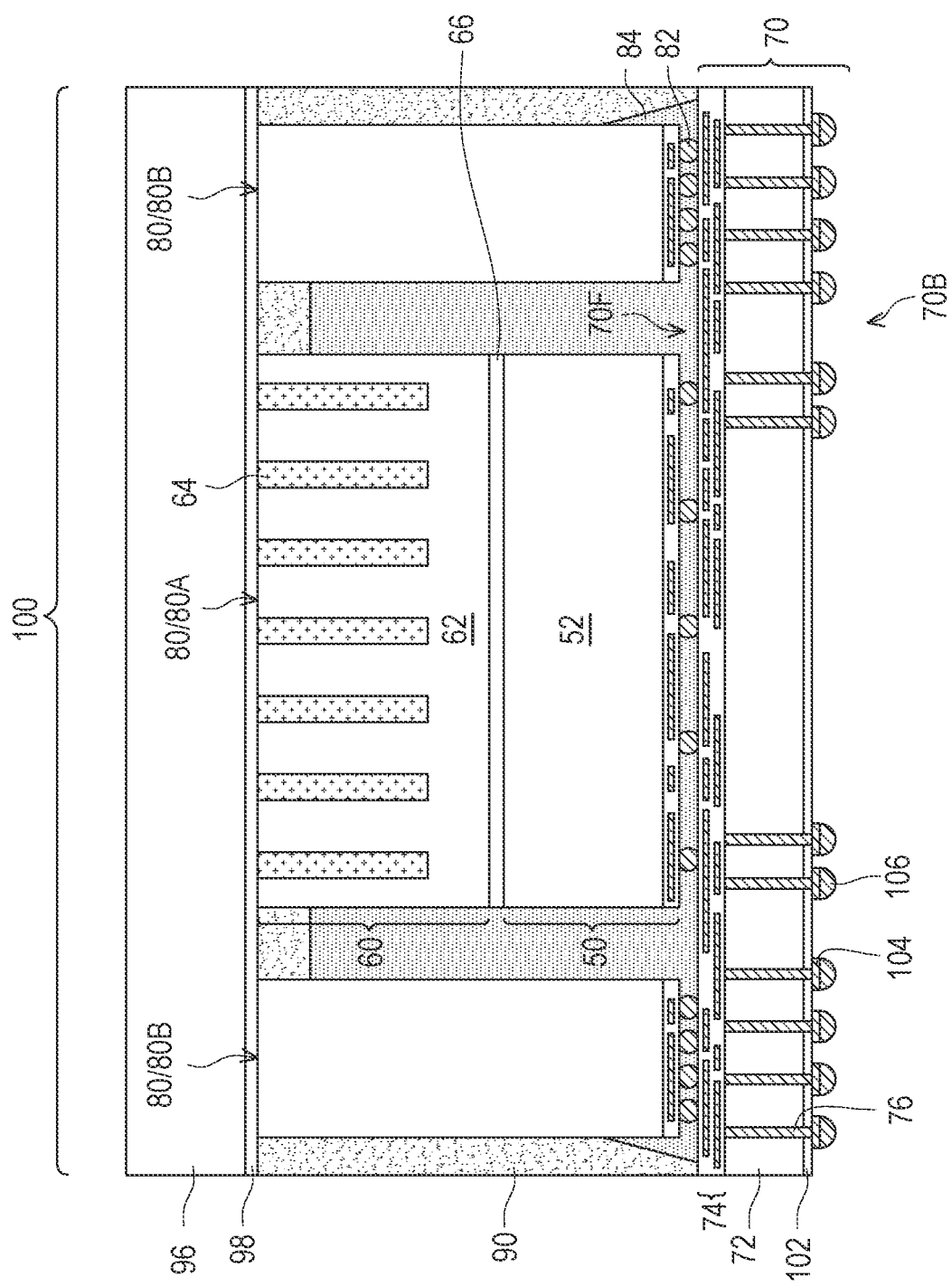

In FIG. 11, the interposer 70 is thinned to expose the through vias 76. Exposure of the through vias 76 may be accomplished by a thinning process, such as a grinding process, a chemical-mechanical polish (CMP), an etch-back, combinations thereof, or the like. In the illustrated embodiment, a recessing process is performed to recess the back surface of the substrate 72 such that the through vias 76 protrude at the back side 70B of the interposer 70. The recessing process may be, e.g., a suitable etch-back process, chemical-mechanical polish (CMP), or the like. In some embodiments, the thinning process for exposing the through vias 76 includes a CMP, and the through vias 76 protrude at the back side 70B of the interposer 70 as a result of dishing that occurs during the CMP or a separate recess etch process. An insulating layer 102 is optionally formed on the back surface of the substrate 72, surrounding the protruding portions of the through vias 76. In some embodiments, the insulating layer 102 is formed of a silicon-containing insulator, such as silicon nitride, silicon oxide, silicon oxynitride, or the like, and may be formed by a suitable deposition method such as spin coating, CVD, plasma-enhanced CVD (PECVD), high-density plasma CVD (HDP-CVD), or the like. Initially, the insulating layer 102 may bury the through vias 76. A removal process can be applied to the various layers to remove excess materials over the through vias 76. The removal process may be a planarization process such as a chemical mechanical polish (CMP), an etch-back, combinations thereof, or the like. After planarization, the exposed surfaces of the through vias 76 and the insulating layer 102 are coplanar (within process variations) and are exposed at the back side 70B of the interposer 70. In another embodiment, the insulating layer 102 is omitted, and the exposed surfaces of the substrate 72 and the through vias 76 are coplanar (within process variations).

Under bump metallurgies (UBMs) 104 may be formed on the exposed surfaces of the through vias 76 and the insulating layer 102 (or the substrate 72, when the insulating layer 102 is omitted). As an example to form the UBMs 104, a seed layer (not separately illustrated) is formed over the exposed surfaces of the through vias 76 and the insulating layer 102 (if present) or the substrate 72. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 104. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 104.

Further, conductive connectors 106 are formed on the UBMs 104. The conductive connectors 106 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 106 may be formed of a conductive material that is reflowable, such as solder, copper, aluminum, gold, nickel, silver, palladium, tin, the like, or a combination thereof. In some embodiments, the conductive connectors 106 are formed by initially forming a layer of solder through evaporation, electroplating, printing, solder transfer, ball placement, or the like. Once a layer of solder has been formed on the structure, a reflow may be performed in order to shape the material into desired bump shapes. In some embodiments, the conductive connectors 106 comprise metal pillars (such as copper pillars) formed by sputtering, printing, electroplating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 12:
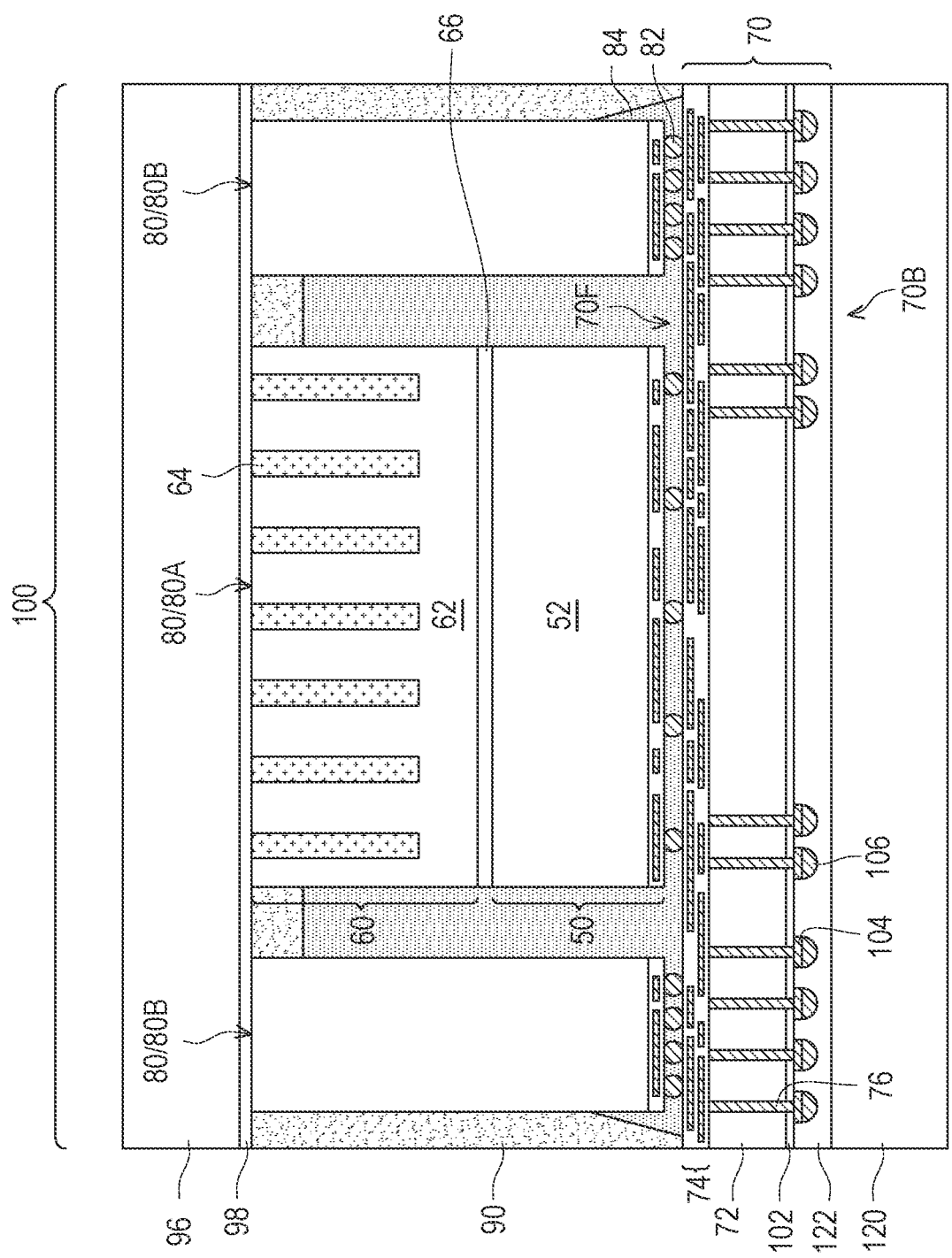

In FIG. 12, the intermediate structure is placed on a carrier substrate 120 or other suitable support structure for subsequent processing. For example, the carrier substrate 120 may be attached to the conductive connectors 106 and a back side 70B of the interposer 70 by a release layer 122. For example, the release layer 122 may have a thickness greater than the conductive connectors 106 for avoiding the conductive connectors 106 from touching the carrier substrate 120, which may reduce damage to the conductive connectors 106. The release layer 122 may have a similar material as the release layer 98, such as a thermal-release material, which may lose its adhesive property when heated, such as LTHC release coating. In some embodiments, the carrier substrate 120 is a bulk semiconductor substrate or a glass substrate having a wafer or panel shape or the like.

Figure 13:
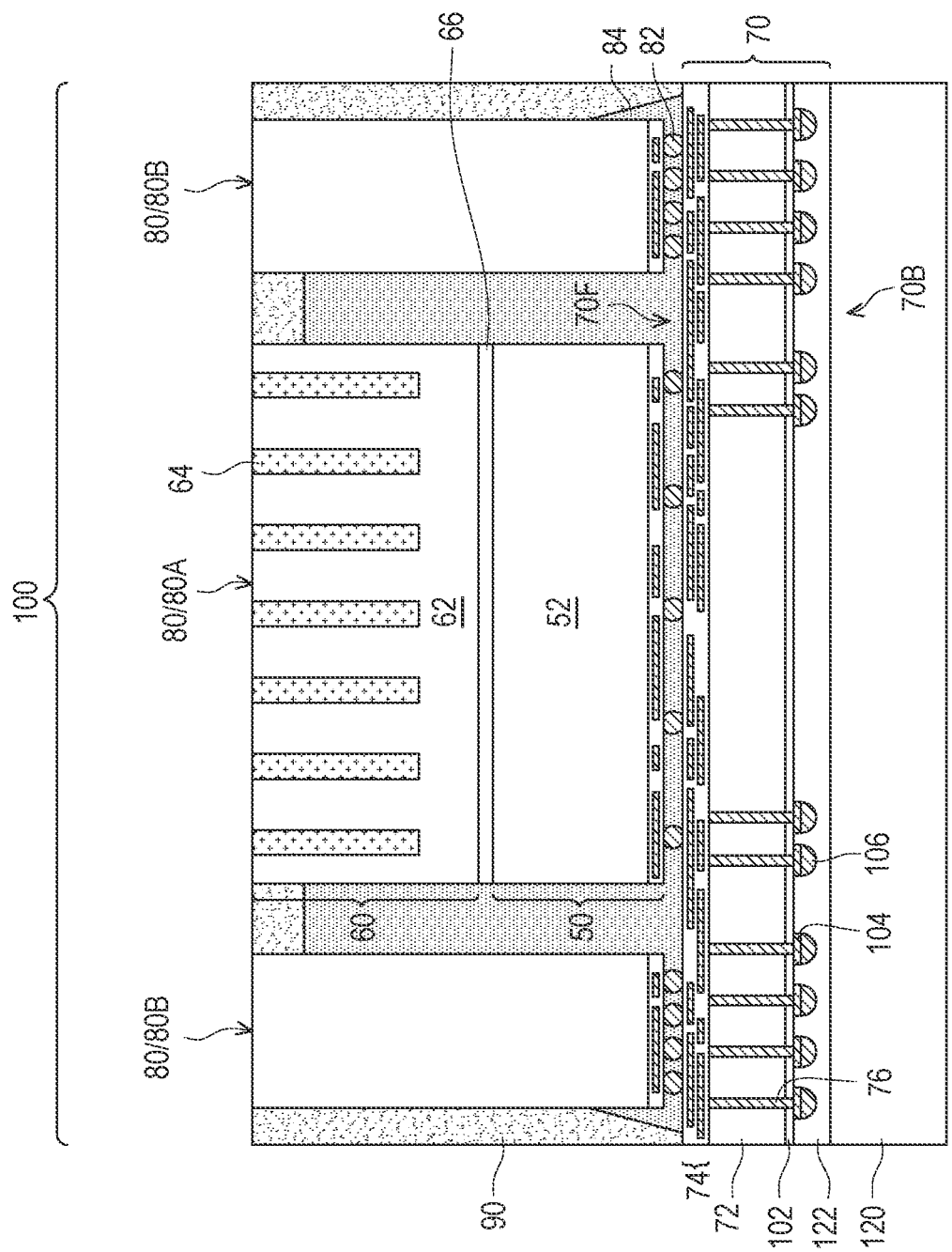

In FIG. 13, a carrier debonding process is performed to detach (debond) the carrier substrate 96 (see FIG. 12) from the first integrated circuit device 80A, the second integrated circuit devices 80B, and the encapsulant 90, thereby exposing the strips 64 embedded in the heat dissipation structure 60. The debonding includes projecting a light such as a laser light or an ultraviolet (UV) light from a top side of the carrier substrate 96 for heating the release layer 98 locally. Accordingly, the release layer 98 may be decomposed under the locally distributed heat of the light, and the carrier substrate 96 can be removed, while the release layer 122 on the back side 70B of the interposer 70 may not be affected.

Figure 14:
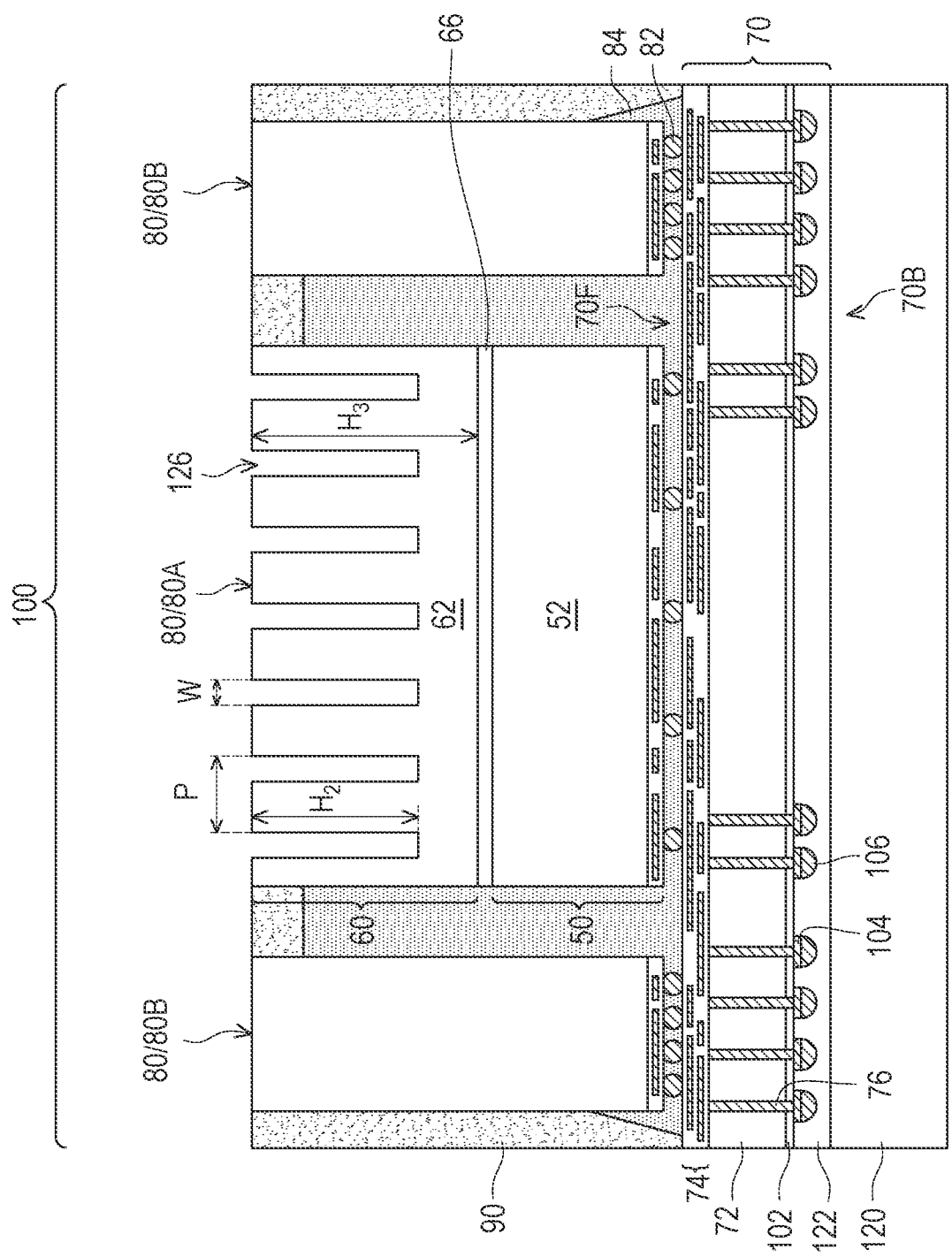

In FIG. 14, the strips 64 embedded in the heat dissipation structure 60 are removed, thereby forming micro-channels 126 in the heat dissipation structure 60 of the first integrated circuit device 80A in accordance with some embodiments. In some embodiments, the micro-channels 126 have a shape corresponding to those of the strips 64, such as having the width W, the pitch P, and the height $H_2$. In some embodiments, the strips 64 are removed by wet etching, with a suitable acidic or basic etching solution. As will be discussed in greater detail below, the micro-channels 126 may allow cooling fluid (such as water, fluorocarbons, or other suitable coolants) to flow through, and heat generated by the first integrated circuit device 80A and/or other devices in the integrated circuit package 100 can be effectively conducted away by the cooling fluid.

Figure 15:
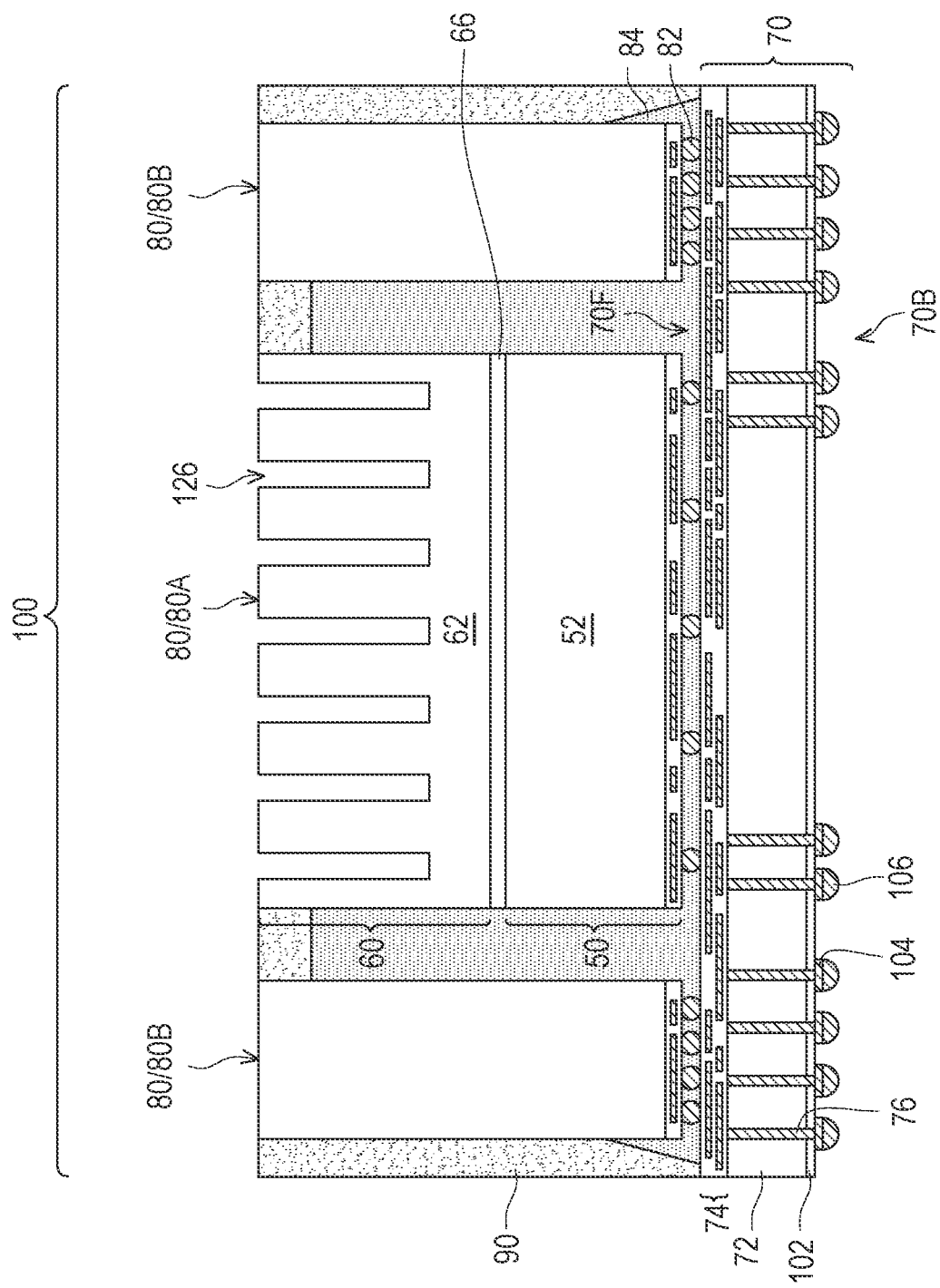

In FIG. 15, a carrier debonding is performed to detach (debond) the carrier substrate 120 (see FIG. 14) from the back side 70B of the interposer 70. The debonding includes projecting a light such as a laser light or a UV light for heating the release layer 122. Accordingly, the release layer 122 may be decomposed under the heat of the light, and the carrier substrate 120 can be removed.

The processes discussed above may be performed at the wafer level, wherein the interposer 70 is wafer sized, and a singulation process is performed. For example, the intermediate structure may be placed on a tape (not shown), and a singulation process is performed by cutting along scribe line regions to form the structure as illustrated in FIG. 15. The singulation process may include sawing, dicing, or the like. For example, the singulation process can include sawing the insulating layer 102, the encapsulant 90, the interconnect structure 74, and the substrate 72. The singulation process singulates the wafer-sized interposer 70 into separate packages. As a result of the singulation process, the outer sidewalls of the interposer 70 and the encapsulant 90 are laterally coterminous (within process variations).

Figure 16:
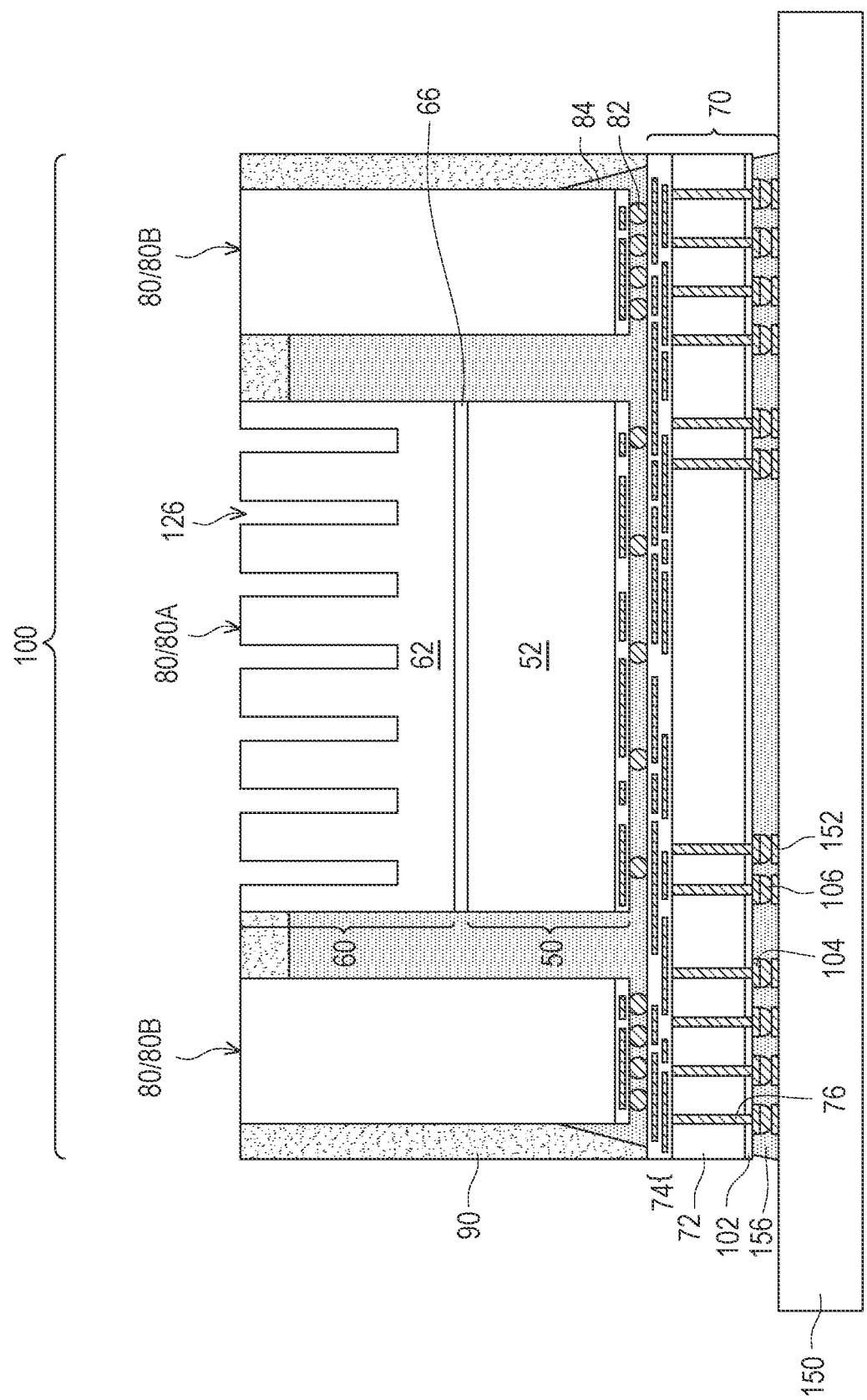
Figure 17:
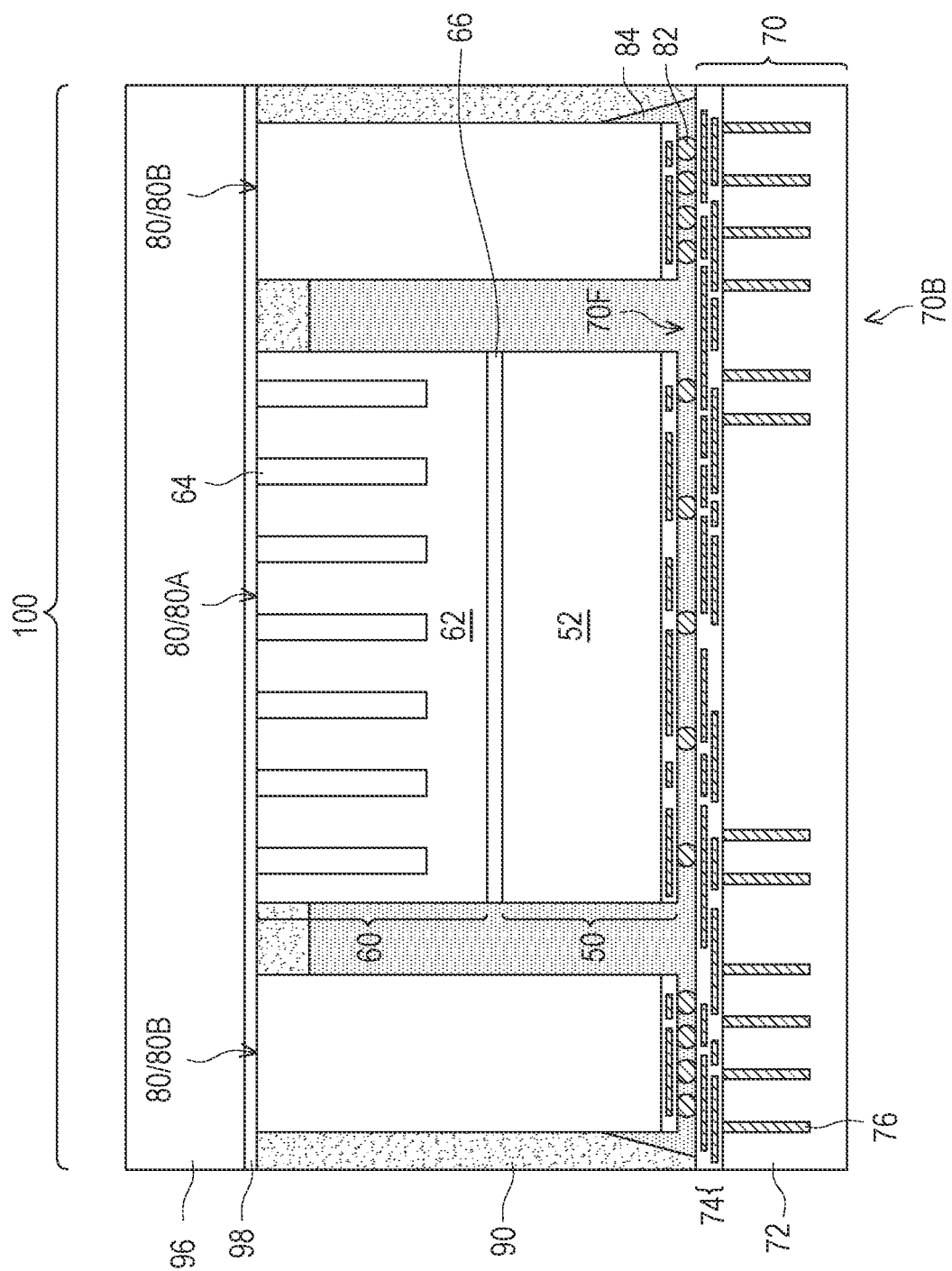

In FIG. 16, one or more of the singulated packages obtained in FIG. 15 is attached to a substrate 150 using the conductive connectors 106. The substrate 150 may be an interposer, a core substrate, a coreless substrate, a printed circuit board (PCB), a package substrate, or the like. The substrate 150 may include active and/or passive devices (not separately illustrated). Devices such as transistors, capacitors, resistors, combinations thereof, and the like may be used to generate the structural and functional requirements of the design for the system. The devices may be formed using any suitable methods.

The substrate 150 may also include metallization layers and vias (not separately illustrated) and bond pads 152 over the metallization layers and vias. The conductive connectors 106 may comprise solder reflowed to attach the UBMs 104 to the bond pads 152. The conductive connectors 106 electrically connect the metallization layers of the interconnect structure 74 of the interposer 70 to the substrate 150, including metallization layers in the substrate 150. Thus, the substrate 150 is electrically connected to the integrated circuit devices 80. In some embodiments, passive devices (e.g., surface mount devices (SMDs), not separately illustrated) may be attached to the back side 70B of the interposer 70 (e.g., bonded to the UBMs 104) prior to mounting on the substrate 150. In such embodiments, the passive devices may be bonded to a same surface of the substrate 150 as the conductive connectors 106.

In some embodiments, an underfill 156 is formed between the interposer 70 and the substrate 150, surrounding the conductive connectors 106 and the UBMs 104. The underfill 156 may be formed by a capillary flow process after substrate 150 is attached or may be formed by a suitable deposition method before the substrate 150 is attached. The underfill 156 may be a continuous material extending from the substrate 150 to the interposer 70 (e.g., the insulating layer 102).

The above manufacturing processes are illustrated for illustration purposes, and not limited thereto. Suitable structural and/or process variations may also be implemented in accordance with some embodiments. For example, the strips 64 may be removed before the thinning of interposer 70 (see FIG. 10). In some embodiments, after thinning the encapsulant 90 to expose the strips 64, as illustrated in FIG. 9, the removal of the strips 64 may be performed to form the micro-channels 126, such as by the removing processes as illustrated in FIG. 14. Next, referring to FIG. 17, the carrier substrate 96 may be attached to the encapsulant 90 and the heat dissipation structure 60 and seal the micro-channels 126 through the release layer 98. Then, processes similar to those as illustrated in FIGS. 11 to 16 may be performed, except that the processes of those as illustrated in FIGS. 12 and 14 may be omitted because the strips 64 are already removed. As such, a structure similar to the structure as illustrated in FIG. 16 may be acquired. Some residual of the release layer 98 may fall into the micro-channels 126, and they may be removed by suitable cleaning processes at any manufacturing stages or by a cooling fluid that flows through the micro-channels 126.

Figure 18A:
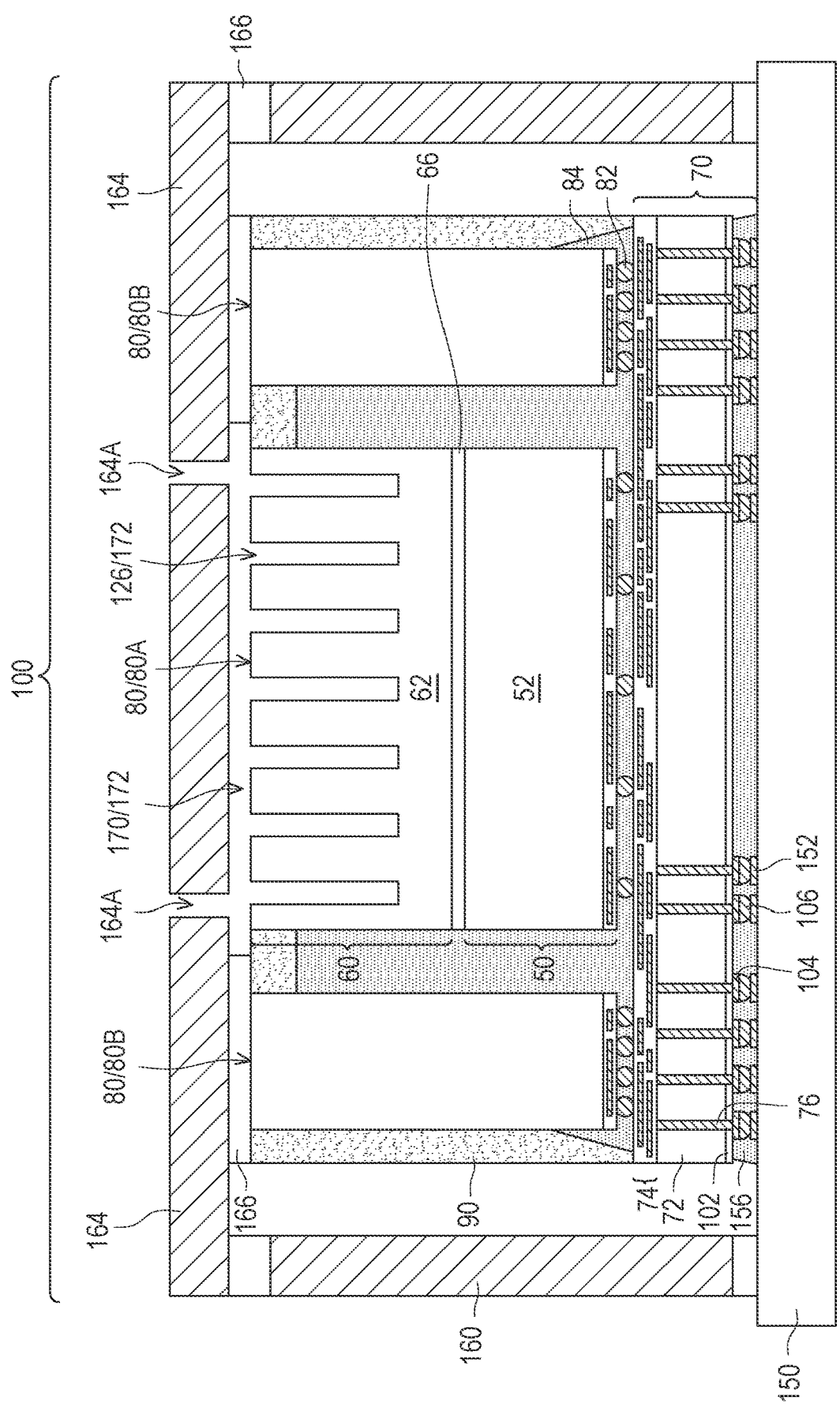
Figure 18B:
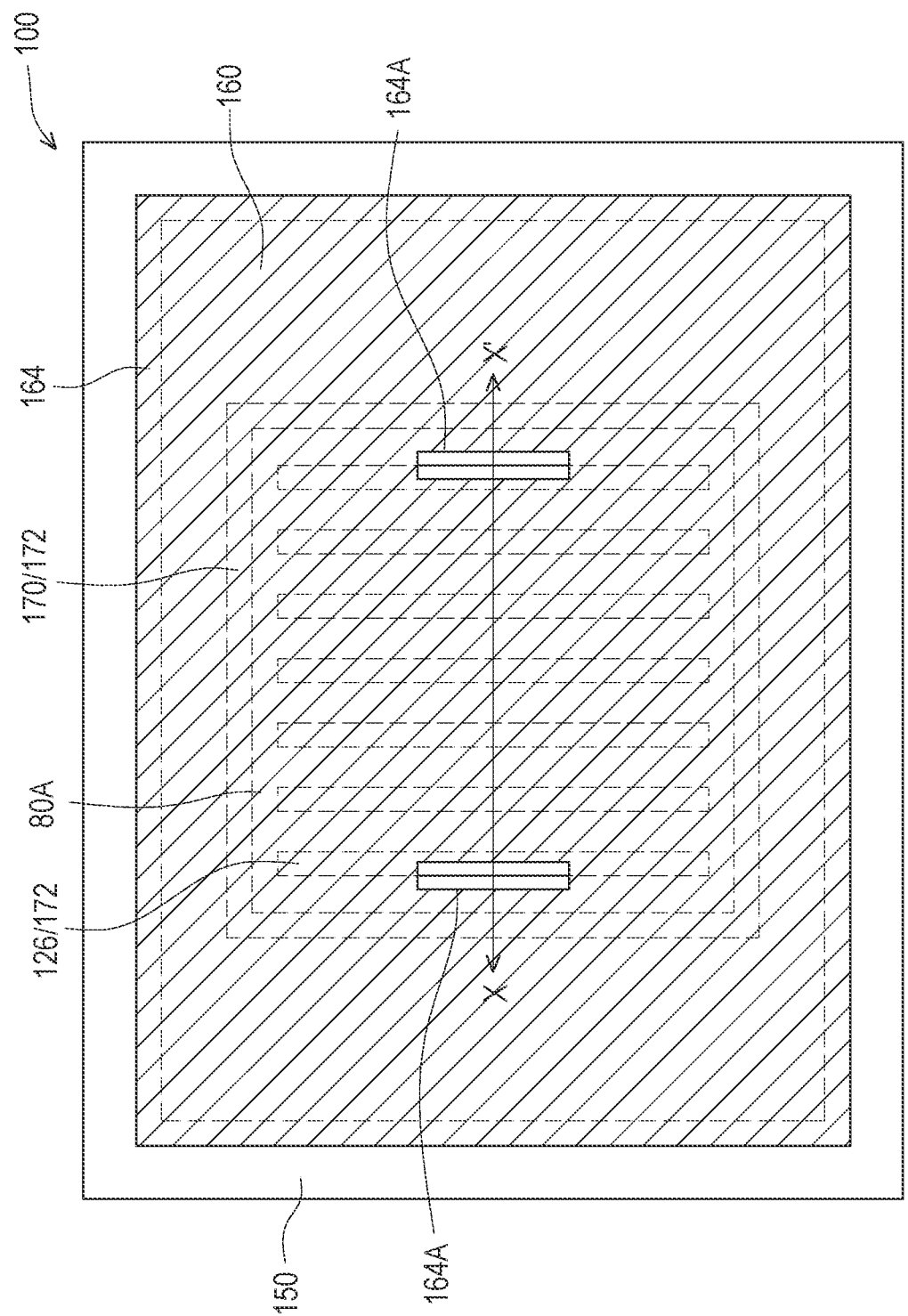
FIGS. 18B and 20B are plan views of intermediate stages in the manufacturing of an integrated circuit package, in accordance with some embodiments.

FIGS. 18A and 18B illustrate a cross-sectional view and a plan view of an intermediate structure of an integrated circuit package 100, respectively, in accordance with some embodiments, wherein FIG. 18A is the cross-sectional view along the section X-X' as illustrated in FIG. 18B. As illustrated in FIG. 18A, a heat dissipation ring 160 is attached to the substrate 150 using an adhesive 162. The heat dissipation ring 160 may laterally surround the integrated circuit devices 80 and the encapsulant 90. Next, a lid 164 is attached to the second integrated circuit devices 80B (if exposed), the encapsulant 90, and/or the heat dissipation ring 160 using an adhesive 166. For example, as illustrated in FIG. 18A, the adhesive 166 is disposed on the heat dissipation ring 160, the second integrated circuit devices 80B and portions of the encapsulant 90 adjacent to the second integrated circuit devices 80B. The adhesive 166 is illustrated as not extending to the heat dissipation structure 60 of the first integrated circuit device 80A, and leaving a portion of the encapsulant 90 adjacent to the first integrated circuit device 80A exposed, for illustrative purposes. In some embodiments, the adhesive 166 may completely cover the encapsulant 90 or extend over a portion of the heat dissipation structure 60. As such, the micro-channels 126 in the heat dissipation structure 60 may still be exposed and not be sealed by the adhesive 166.

The lid 164 covers the heat dissipation structure 60 and includes inlet/outlet openings 164A. The lid 164 together with the adhesive 166, the encapsulant 90, and the bulk substrate 62 of the heat dissipation structure 60 form a cavity 170 between the inlet/outlet openings 164A, and through which fluid may be flown over the heat dissipation structure 60. In some embodiments, a cooling fluid may flow through one of the inlet/outlet openings 164A, into the cavity 170 and the micro-channels 126, and out through the other one of the inlet/outlet openings 164A. The inlet/outlet openings 164A may be disposed at any positions that can connect to the cavity 170 and may have any suitable quantities and shapes. For example, FIG. 18B illustrates an example of the inlet/outlet openings 164A. The inlet/outlet openings 164A may be disposed adjacent to the micro-channels 126 and connect to the cavity 170. The inlet/outlet openings 164A, the cavity 170, and the micro-channels 126 may be collectively referred to as a thermal dissipation pathway 172.

The cooling fluid may be water, fluorocarbons, chlorocarbons, ethylene glycol, propylene glycol, a combination thereof, or other suitable cooling materials. In some embodiments, when the integrated circuit package 100 is in operation, the cooling fluid may continuously flow through the thermal dissipation pathway 172, including flowing through the micro-channels 126 in the heat dissipation structure 60, so that heat generated by the first integrated circuit device 80A may be effectively conducted away by the flowing cooling fluid. The heat generated by the second integrated circuit devices 80B is conducted through the adhesive 166, the lid 164, and the heat dissipation ring 160 and dissipated away by the substrate 150. Since the lid 164 and the adhesive 166 may be in contact with the cavity 170, at least a portion of the heat generated by the second integrated circuit devices 80B may also be conducted away by the cooling fluid.

In some embodiments, the adhesive 162 and the adhesive 166 are formed of the same material. In some embodiments, the material of the adhesive 162 is different from that of the adhesive 166. For example, the adhesive 166 may have a better sealing property than the adhesive 162 to prevent/reduce leakage of the cooling fluid. In some embodiments, the heat dissipation ring 160 and the lid 164 may be made of a metal or a metal alloy, for example, aluminum, copper, nickel, cobalt, an alloy thereof, or a combination thereof, or other materials, such as silicon carbide, aluminum nitride, graphite, and the like. In some embodiments, the heat dissipation ring 160 is the same material as the lid 164.

Figure 19:
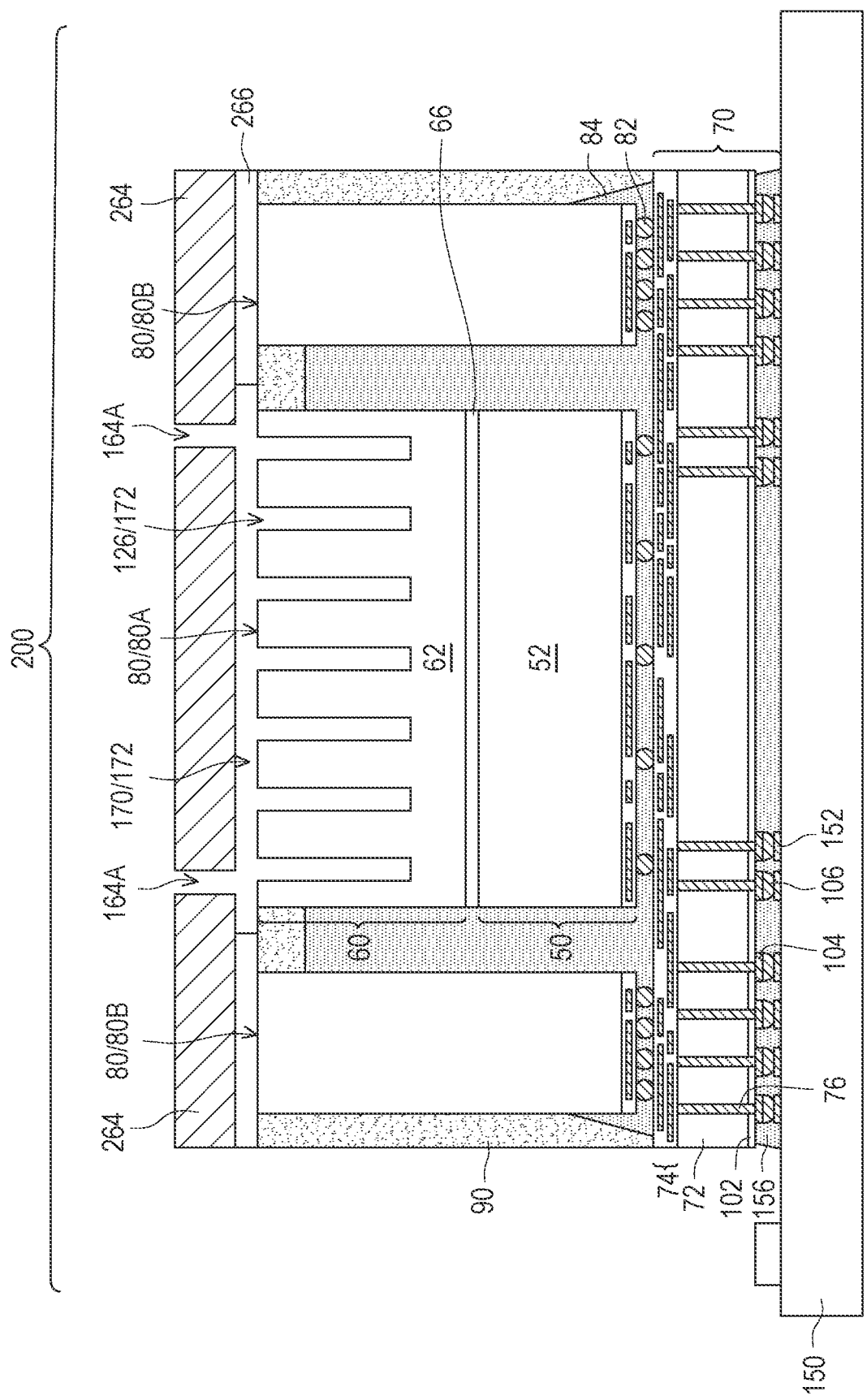

FIG. 19 illustrates a cross-sectional view of an intermediate structure of an integrated circuit package 200 in accordance with some embodiments. The integrated circuit package 200 may include similar features as the integrated circuit package 100, wherein like reference numerals refer to like elements. As illustrated in FIG. 19, the integrated circuit package 200 does not have a heat dissipation ring, and the lid 264 is directly attached to the second integrated circuit devices 80B and the encapsulant 90 through the adhesive 266 in accordance with some embodiments. The adhesive 266 is illustrated as not extending to the heat dissipation structure 60 of the first integrated circuit device 80A, and leaving a portion of the encapsulant 90 adjacent to the first integrated circuit device 80A exposed, for illustrative purposes. In some embodiments, the adhesive 266 completely covers the encapsulant 90 or extends over a portion of the heat dissipation structure 60. In some embodiments, the adhesive 266 is formed of a similar material as the adhesive 166. In some embodiments, the lid 264 has a same width as the encapsulant 90, though other widths may be used and contemplated. In the embodiment shown, although the heat generated by the second integrated circuit devices 80B may not be dissipated to the substrate 150 through a heat dissipation ring, it may be conducted away through the lid 264 and the cooling fluid flowing through the thermal dissipation pathway 172, and a compact integrated circuit package is obtained.

Figure 20A:
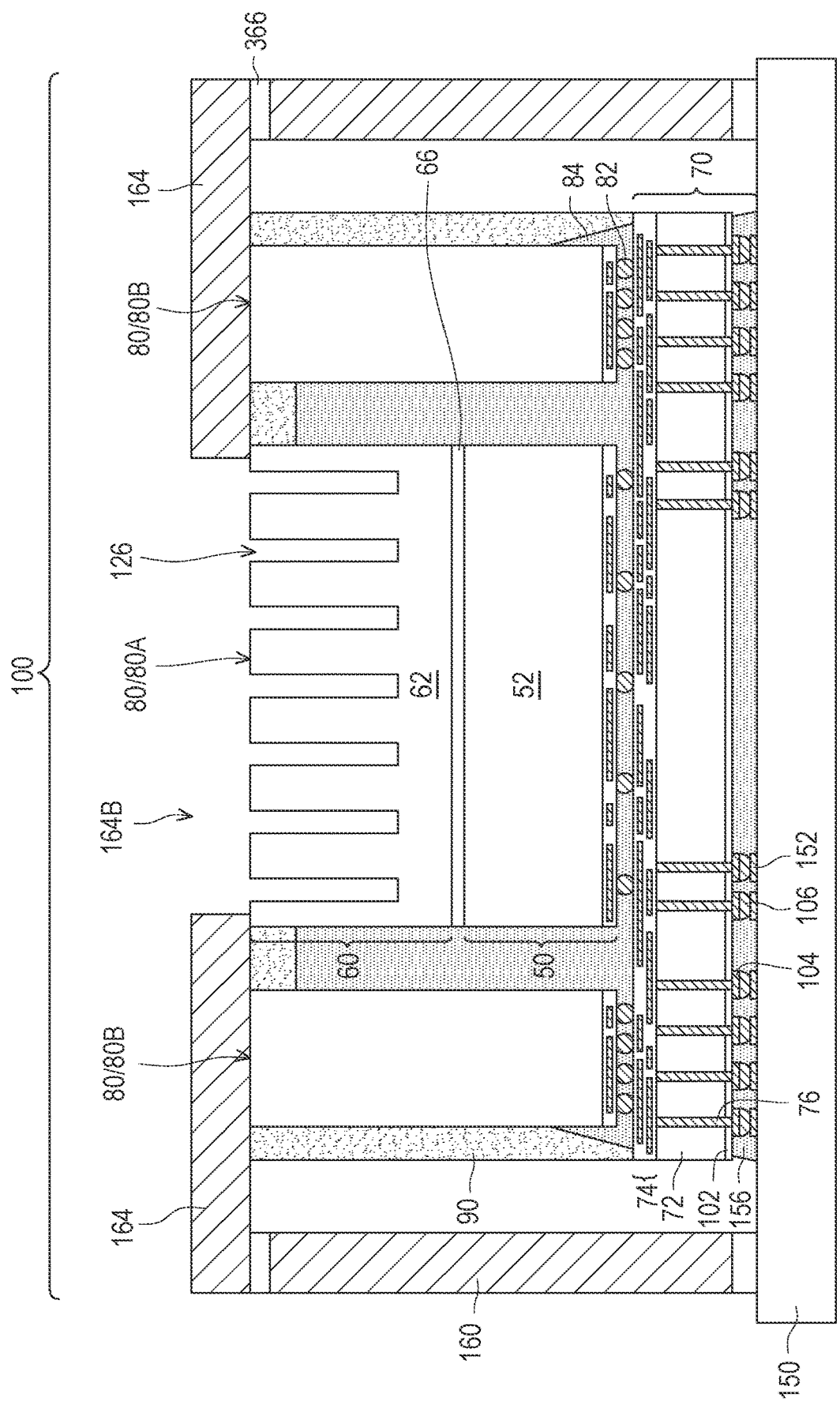
Figure 20B:
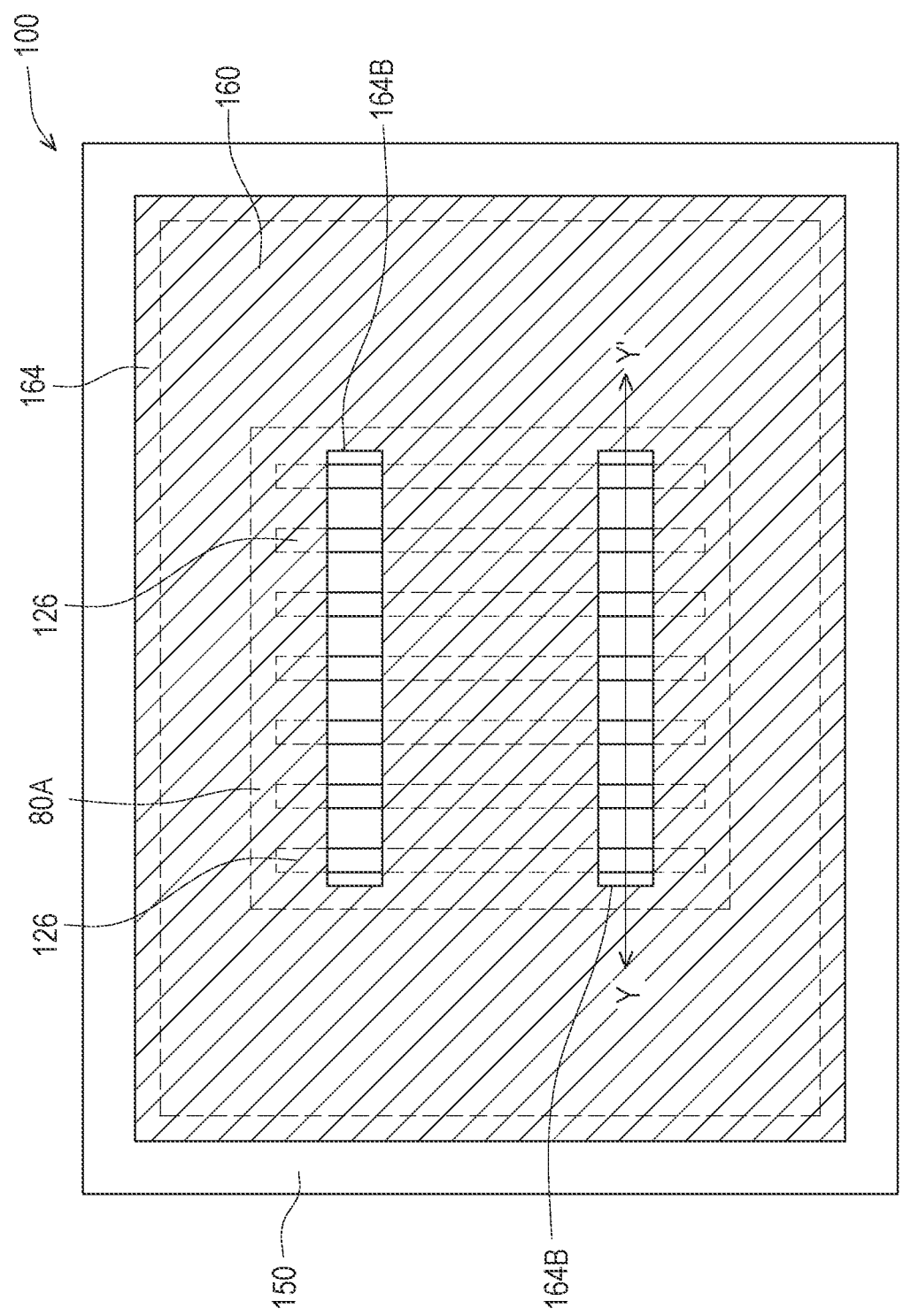

FIGS. 20A and 20B illustrate a cross-sectional view and a plan view of an intermediate structure of an integrated circuit package 300, respectively, wherein FIG. 20A is the cross-sectional view along the section Y-Y' as illustrated in FIG. 20B. In FIG. 20B, the micro-channels 126 are illustrated by dotted lines. The integrated circuit package 300 may include similar features as the integrated circuit package 100, wherein like reference numerals refer to like elements. As illustrated in FIG. 20A, the adhesive 366 is disposed on the heat dissipation ring 160, and the lid 164 is in contact with heat dissipation structure 60 of the first integrated circuit device 80A, the second integrated circuit devices 80B, and the encapsulant 90. As such, the lid 164 may be disposed over the top of the micro-channels 126. The lid 164 may be in contact with the heat dissipation structure 60 of the first integrated circuit device 80A and at least partially seal the micro-channels 126. The cooling fluid may flow through one of the inlet/outlet openings 164B, into the micro-channels 126, and out through the other one of the inlet/outlet openings 164B. Referring to FIG. 20B, the inlet/outlet openings 164B may extend across a plurality of micro-channels 126 for allowing the cooling fluid to flow through all of the micro-channels 126. It is appreciated that the two rectangular inlet/outlet openings 164B in FIG. 20B are for illustration purposes only, and any quantities, locations, and shapes of the inlet/outlet openings 164B may be used and complemented. Because the second integrated circuit devices 80B may be in direct contact with the lid 164, the thermal conducting efficiency from the second integrated circuit devices 80B to the lid 164 may be improved, and is not limited thereto.

A package including an integrated circuit device attached to an interposer and a method of forming the same are provided in accordance with some embodiments. In some embodiments, the integrated circuit device includes a heat dissipation structure attached to an inactive surface of an integrated circuit die. The heat dissipation structure may include a plurality of micro-channels recessed from its top surface, which may allow a cooling fluid may flow through. Accordingly, heat generated by the integrated circuit device and/or other integrated circuit devices in the package can be conducted away by a cooling fluid that may continuously flow through the micro-channels. The heat dissipation efficiency of the package may be improved.

In an embodiment, a package includes an interposer; a first integrated circuit device attached to the interposer, wherein the first integrated circuit device includes a die and a heat dissipation structure, the die having an active surface facing the interposer and an inactive surface opposite to the active surface, the heat dissipation structure attached to the inactive surface of the die and including a plurality of channels recessed from a first surface of the heat dissipation structure, the first surface of the heat dissipation structure facing away from the die; and an encapsulant disposed on the interposer and laterally around the die and the heat dissipation structure, wherein a top surface of the encapsulant is coplanar with the top surface of the heat dissipation structure. In an embodiment, the package further includes an oxide layer interposed between the die and the heat dissipation structure. In an embodiment, the die and the heat dissipation structure have a same width. In an embodiment, the package further includes a second integrated circuit device attached to the interposer and disposed adjacent to the first integrated circuit device, wherein the second integrated circuit device is laterally surrounded by the encapsulant and has a top surface coplanar with the top surface of the encapsulant. In an embodiment, the package further includes a lid attached to the encapsulant using an adhesive, wherein the lid extends over portions of the channels in the heat dissipation structure. In an embodiment, the lid includes a first opening and a second opening extending through the lid, wherein the lid, the adhesive, and the heat dissipation structure form a cavity extending from the first opening to the second opening. In an embodiment, the lid has a same width as the encapsulant. In an embodiment, the package further includes an underfill disposed on the interposer and in contact with a sidewall of the heat dissipation structure. In an embodiment, a bottom surface of the channels is lower than a top surface of the underfill.

In an embodiment, a package includes an interposer; an integrated circuit device bonded to a front side of the interposer, wherein the integrated circuit device includes a die and a heat dissipation structure, the die having an active surface facing the interposer and an inactive surface opposite to the interposer, the heat dissipation structure disposed on the die and including a plurality of channels recessed from a top surface of the heat dissipation structure; an encapsulant disposed on the interposer and laterally surrounding the integrated circuit device; and a lid disposed on the encapsulant and the heat dissipation structure, wherein the lid extends over the plurality of channels. In an embodiment, a top surface of the heat dissipation structure is coplanar with a top surface of the encapsulant. In an embodiment, the package further includes a substrate attached to a back side of the interposer opposite to the front side of the interposer; and a ring structure disposed between the lid and the substrate, the ring structure laterally surrounding the interposer, the encapsulant, and the integrated circuit device. In an embodiment, the lid is in contact with the heat dissipation structure of the integrated circuit device and the encapsulant. In an embodiment, the lid and the encapsulant have a same width. In an embodiment, the lid further includes an opening through the lid.

In an embodiment, a method for forming a package is provided. The method includes attaching an integrated circuit device to an interposer, wherein the integrated circuit device includes a first die and a first heat dissipation structure, the first die having an active surface facing the interposer and an inactive surface opposite to the active surface, the first heat dissipation structure including a semiconductor substrate attached to the inactive surface of the first die, the first heat dissipation structure including a plurality of strips embedded in the semiconductor substrate and exposed from a top surface of the semiconductor substrate, wherein the plurality of strips include a material different than the semiconductor substrate; disposing an encapsulant on the interposer, the encapsulant laterally surrounding the first die and the first heat dissipation structure, the encapsulant extending over the plurality of strips; performing a thinning process to remove a portion of the encapsulant and to expose the plurality of strips; and removing the plurality of strips to form channels in the first heat dissipation structure. In an embodiment, the thinning process includes removing a portion of the semiconductor substrate and a portion of the plurality of strips. In an embodiment, the integrated circuit device is formed by bonding a first wafer and a second wafer and then sawing the first wafer and the second wafer, wherein the first wafer includes a plurality of dies and the second wafer includes a plurality of heat dissipation structures, wherein the first die is one of the plurality of dies, wherein the first heat dissipation structure is one of the plurality of heat dissipation structures. In an embodiment, removing the plurality of strips includes a wet etching process. In an embodiment, the method further includes attaching a lid to a top surface of the encapsulant after removing the plurality of strips, the lid having a first opening and a second opening over the channels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package, the method comprising:
    attaching an integrated circuit device to an interposer, wherein the integrated circuit device comprises a first die and a first heat dissipation structure, the first die having an active surface facing the interposer and an inactive surface opposite to the active surface, the first heat dissipation structure comprising a semiconductor substrate attached to the inactive surface of the first die, the first heat dissipation structure comprising a plurality of strips embedded in the semiconductor substrate and exposed from a top surface of the semiconductor substrate, wherein the plurality of strips comprise a material different than the semiconductor substrate;
    disposing an encapsulant on the interposer, the encapsulant laterally surrounding the first die and the first heat dissipation structure, the encapsulant extending over the plurality of strips;
    performing a thinning process to remove a portion of the encapsulant and to expose the plurality of strips; and
    removing the plurality of strips to form channels in the first heat dissipation structure.

2. The method of claim 1, wherein the thinning process comprises removing a portion of the semiconductor substrate and a portion of the plurality of strips.

3. The method of claim 1, wherein the integrated circuit device is formed by bonding a first wafer and a second wafer and then sawing the first wafer and the second wafer, wherein the first wafer comprises a plurality of dies and the second wafer comprises a plurality of heat dissipation structures, wherein the first die is one of the plurality of dies, wherein the first heat dissipation structure is one of the plurality of heat dissipation structures.

4. The method of claim 1, wherein removing the plurality of strips comprises a wet etching process.

5. The method of claim 1, further comprising attaching a lid to a top surface of the encapsulant after removing the plurality of strips, the lid having a first opening and a second opening over the channels.

6. A method for forming a package, the method comprising:
    attaching a first integrated circuit device to an interposer, wherein the first integrated circuit device comprises a die and a heat dissipation structure, the die having an active surface facing the interposer and an inactive surface opposite to the active surface, the heat dissipation structure attached to the inactive surface of the die and comprising a plurality of channels recessed from a first surface of the heat dissipation structure, wherein the plurality of channels are filled with a sacrificial material, the first surface of the heat dissipation structure facing away from the die;
    forming an encapsulant disposed on the interposer and laterally around the die and the heat dissipation structure, wherein a top surface of the encapsulant is coplanar with the first surface of the heat dissipation structure; and
    after forming the encapsulant, removing the sacrificial material.

7. The method of claim 6, wherein the first integrated circuit device comprises an oxide layer interposed between the die and the heat dissipation structure.

8. The method of claim 6, wherein the die and the heat dissipation structure have a same width along a direction parallel to a major surface of the first integrated circuit device.

9. The method of claim 6, further comprising:
    attaching a second integrated circuit device, disposed adjacent to the first integrated circuit device, to the interposer, wherein forming the encapsulant comprises forming the encapsulant laterally around the second integrated circuit device, wherein a top surface of the second integrated circuit device is coplanar with the top surface of the encapsulant.

10. The method of claim 6, further comprising:
    attaching a lid to the encapsulant using an adhesive, wherein the lid extends over portions of the channels in the heat dissipation structure.

11. The method of claim 10, wherein the lid comprises a first opening and a second opening extending through the lid, wherein the lid, the adhesive, and the heat dissipation structure form a cavity extending from the first opening to the second opening.

12. The method of claim 10, wherein the lid has a same width as the encapsulant along a direction parallel to a major surface of the first integrated circuit device.

13. The method of claim 6, further comprising:
    dispensing an underfill on the interposer and in contact with a sidewall of the heat dissipation structure.

14. The method of claim 13, wherein a bottom surface of the channels is lower than a top surface of the underfill.

15. A method for forming a package, the method comprising:
    bonding an integrated circuit device to a front side of an interposer, wherein the integrated circuit device comprises a die and a heat dissipation structure, the die having an active surface facing the interposer and an inactive surface opposite to the interposer, the heat dissipation structure disposed on the die and comprising a plurality of channels recessed from a top surface of the heat dissipation structure, wherein the plurality of channels are filled with a sacrificial material;

after bonding the integrated circuit device, dispensing an encapsulant on the interposer and laterally surrounding the integrated circuit device;

removing the sacrificial material; and attaching a lid to the encapsulant and the heat dissipation structure, wherein the lid extends over the plurality of channels.

16. The method of claim 15, wherein a top surface of the heat dissipation structure is coplanar with a top surface of the encapsulant.

17. The method of claim 15, further comprising:

attaching a substrate to a back side of the interposer opposite to the front side of the interposer; and attaching a ring structure to the substrate, the ring structure laterally surrounding the interposer, the encapsulant, and the integrated circuit device, wherein attaching the lid comprises attaching the lid to the ring structure.

18. The method of claim 15, wherein the lid is in contact with the heat dissipation structure of the integrated circuit device and the encapsulant.

19. The method of claim 15, wherein the lid and the encapsulant have a same width along a direction parallel to a major surface of the integrated circuit device.

20. The method of claim 15, wherein the lid further comprises an opening through the lid.

\* \* \* \* \*